US011189562B1

(12) United States Patent
Chu et al.

(10) Patent No.: US 11,189,562 B1
(45) Date of Patent: Nov. 30, 2021

(54) INTERCONNECTION STRUCTURE HAVING INCREASED CONDUCTIVE FEATURES AND METHOD OF MANUFACTURING THE SAME

(71) Applicant: NANYA TECHNOLOGY CORPORATION, New Taipei (TW)

(72) Inventors: Chen Chu, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/886,133

(22) Filed: May 28, 2020

(51) Int. Cl.
*H01L 23/522* (2006.01)
*H01L 23/528* (2006.01)
*H01L 21/3213* (2006.01)
*H01L 21/768* (2006.01)
*H01L 23/31* (2006.01)

(52) U.S. Cl.
CPC .... *H01L 23/5226* (2013.01); *H01L 21/32139* (2013.01); *H01L 21/7682* (2013.01); *H01L 21/76834* (2013.01); *H01L 21/76837* (2013.01); *H01L 21/76885* (2013.01); *H01L 23/3171* (2013.01); *H01L 23/5283* (2013.01)

(58) Field of Classification Search
CPC .......... H01L 23/5226; H01L 21/76885; H01L 21/32139; H01L 23/5283; H01L 21/76834; H01L 21/7682; H01L 23/3171; H01L 21/76837
See application file for complete search history.

(56) References Cited

U.S. PATENT DOCUMENTS

2015/0162278 A1* 6/2015 Zhang ............... H01L 21/76807
257/773
2020/0411374 A1* 12/2020 Huang .............. H01L 21/76837
2021/0159117 A1* 5/2021 Wang ................ H01L 21/76802

* cited by examiner

*Primary Examiner* — Karen Kusumakar
(74) *Attorney, Agent, or Firm* — Muncy, Geissler, Olds & Lowe, P.C.

(57) ABSTRACT

The present disclosure provides a semiconductor device and a method of manufacturing the same. The semiconductor device includes a substrate, a diffusion barrier layer, a passivation layer, and a plurality of conductive features. The diffusion barrier layer is disposed on the substrate, and the passivation layer is disposed on the diffusion barrier layer. The conductive features penetrate through the passivation layer and contact the diffusion barrier layer.

7 Claims, 25 Drawing Sheets

INTERCONNECTION STRUCTURE HAVING INCREASED CONDUCTIVE FEATURES AND METHOD OF MANUFACTURING THE SAME

TECHNICAL FIELD

The present disclosure relates to a wiring structure for use in a semiconductor integrated circuit and a method of manufacturing the same, and more particularly, to an interconnect structure of a semiconductor device having conductive features with a high aspect ratio and continuous configuration, and a method of manufacturing the same.

DISCUSSION OF THE BACKGROUND

In order to build modern integrated circuits, it is necessary to fabricate millions of active devices such as transistors on a single substrate. These individual devices are electrically connected by means of metal wires to form circuits. Further, interconnects ("vias") are used to electrically connect lower and upper metal wirings. Since active devices invariably require more than one level of interconnect, a multi-level interconnect structure is a key element for ultra-large-scale integration (ULSI) technology.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a diffusion barrier layer, a passivation layer and a plurality of conductive features. The diffusion barrier layer is disposed on the substrate. The passivation layer is disposed on the diffusion barrier layer. The plurality of conductive features penetrate through the passivation layer and contact the diffusion barrier layer.

In some embodiments, the conductive features are arranged in an equally-spaced configuration.

In some embodiments, the conductive features have an aspect ratio greater than 1.

In some embodiments, the conductive feature has a thickness less than 37 nm.

In some embodiments, the semiconductor device further comprises a plurality of insulative liners interposed between the conductive features and the passivation layer.

In some embodiments, the passivation layer has a first dielectric constant, and the insulative liners have a second dielectric constant greater than the first dielectric constant.

In some embodiments, the substrate includes a semiconductor wafer, at least one main component, a dielectric layer, a wiring layer and at least one plug. The main component is disposed in the semiconductor wafer. The dielectric layer covers the semiconductor wafer and the main component. The wiring layer is surrounded by the dielectric layer, and the plug is disposed in the dielectric layer to connect the main component to the wiring layer. The diffusion barrier layer is disposed on the dielectric layer and the wiring layer.

In some embodiments, the semiconductor device further includes a plurality of voids buried in the passivation layer.

In some embodiments, the voids are disposed between the conductive features.

Another aspect of the present disclosure provides a method of manufacturing a semiconductor device. The method includes steps of depositing a diffusion barrier layer on a substrate; depositing a conductive layer on the diffusion barrier layer; patterning the conductive layer using a target pattern as a mask to form a plurality of conductive features spaced by a plurality of trenches; and depositing a passivation layer in the trench.

In some embodiments, the method further includes a step of forming a plurality of insulative liners on peripheries of the conductive features prior to the deposition of the passivation layer.

In some embodiments, the forming of the insulative liners includes steps of depositing an insulative layer to cover the conductive features and the diffusion barrier layer exposed through the trenches, wherein the insulative layer has a topology following the topology of the conductive features and the diffusion barrier layer; and removing portions of the insulative layer on topmost surfaces of the conductive features and the diffusion barrier layer.

In some embodiments, the method further includes a step of enclosing a plurality of voids in the passivation layer.

In some embodiments, the formation of the conductive features includes steps of applying a photosensitive layer on the conductive layer; performing a first exposure process to expose portions of the photosensitive layer to actinic radiation through a mask; performing a second exposure process to expose other portions of the photosensitive layer to actinic radiation through the mask; performing a developing process to remove the portions exposed to the actinic radiation and form the target pattern; and performing an etching process to remove portions of the conductive layer not covered by the target pattern.

In some embodiments, the formation of the conductive features includes steps of forming a sacrificial layer on the conductive layer; applying a first photosensitive layer on the sacrificial layer; performing a first lithography process on the first photosensitive layer to remove portions of the first photosensitive layer exposed to actinic radiation through a mask; performing a first etching process to remove portions of the sacrificial layer not covered by unexposed portions of the first photosensitive layer to form a plurality of sacrificial blocks; applying a second photosensitive layer on the sacrificial blocks; performing a second lithography process on the second photoresist layer to remove portions of the second photosensitive layer exposed to actinic radiation through the mask; performing a second etching process to remove portions of the sacrificial blocks not covered by unexposed portions of the second photosensitive layer to form the target pattern; and performing a third etching process to remove portions of the conductive layer exposed through the target pattern.

In some embodiments, the diffusion barrier layer has a first thickness, and the conductive features have a second thickness greater than the first thickness.

In some embodiments, the second thickness of the conductive feature is less than 37 nm, and an aspect ratio of the conductive feature is greater than 1.

With the above-mentioned configurations of the interconnect structure, the density of the conductive features, having continuous configuration, over the substrate can be increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
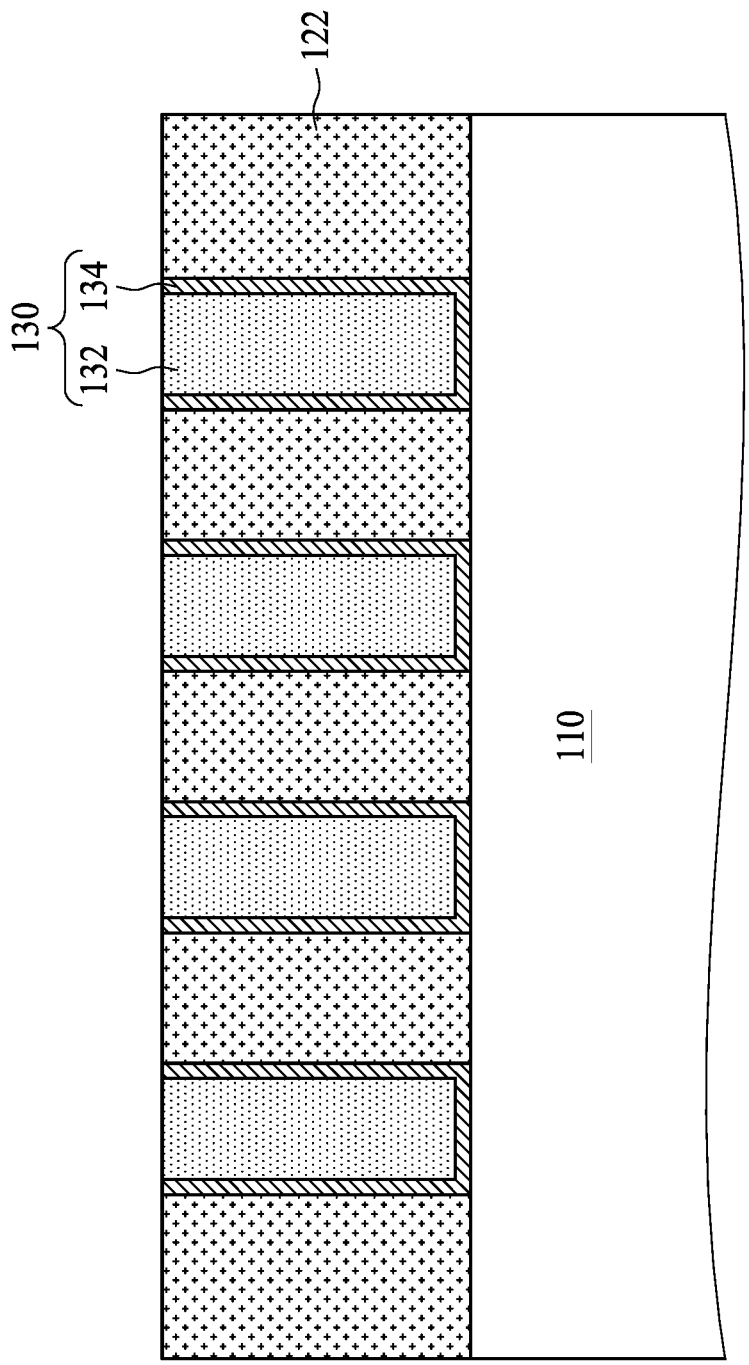
FIG. 1 is a cross-sectional view of a comparative semiconductor device.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a comparative semiconductor device 10. The semiconductor device 10 includes a semiconductor substrate 110, a dielectric layer 122 disposed on the semiconductor substrate 110, and a plurality of interconnect structures 130 disposed in the dielectric layer 122. The interconnect structures 130 include a conductive feature 132 disposed in the dielectric layer 122 and a diffusion barrier liner 134 sandwiched between the dielectric layer 122 and the conductive feature 132. A portion of the diffusion barrier liner 134 between the dielectric layer 122 and the conductive feature 132 functions as an adhesive layer to prevent the conductive feature 132 from flaking or spalling from the dielectric layer 122.

It should be noted that the diffusion barrier liner 134 is further interposed between the semiconductor substrate 110 and the conductive feature 132 if the interconnect structure 130, formed in back-end-of-line (BEOL) processes, for example, penetrates through the dielectric layer 122. The diffusion barrier liner 134 can isolate the conductive feature 132 from the semiconductor substrate 110 containing silicon, thereby preventing the metal in the conductive feature 132 from diffusing into the semiconductor substrate 110. The interconnect structures 130 formed in the BEOL processes are employed to electrically connect individual devices (not shown) disposed in the semiconductor substrate 110 formed in front-end-of-line (FEOL) processes.

Figure 2:
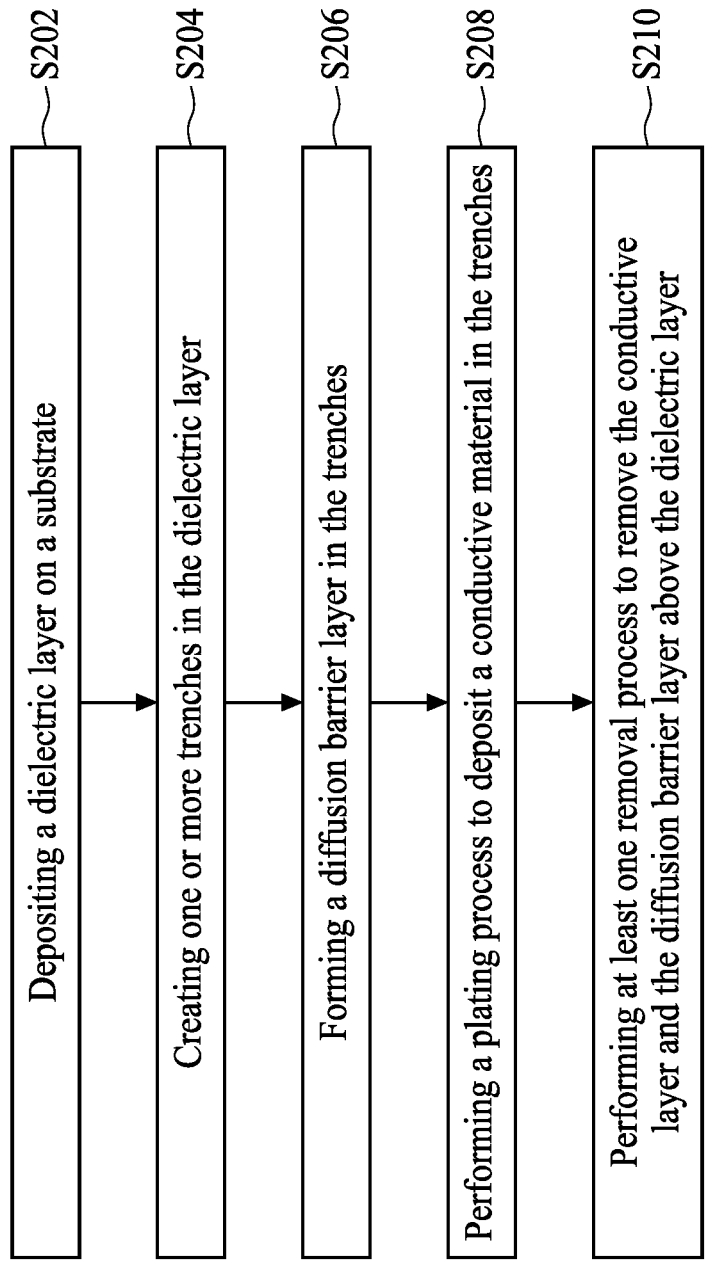
FIG. 2 is a flow diagram illustrating a method of manufacturing a comparative semiconductor device.

The comparative semiconductor device 10 shown in FIG. 1 can be manufactured by a method 20 shown in FIG. 2. Referring to FIG. 2, the method 20 includes a step S202 of depositing a dielectric layer on a substrate; a step S204 of creating one or more trenches in the dielectric layer; a step S206 of depositing a diffusion barrier layer in the trenches; a step S208 of performing a plating process to deposit a conductive material in the trenches; and a step S210 of performing a removal process to remove the diffusion barrier layer and the conductive layer above the dielectric layer.

The following describes an exemplary process flow of the method 20 of manufacturing the comparative semiconductor device 10.

The method 20 can begin with the step S202, in which the dielectric layer 120 is deposited on a front surface 112 of the semiconductor substrate 110 that has various device elements (not shown). After the deposition of the dielectric layer 120, a planarizing process can be performed on the dielectric layer 120 to yield an acceptably flat topology.

Next, a patterned mask 140 is applied on the dielectric layer 120. The patterned mask 140 can be a hard mask and includes a plurality of windows 142 to expose portions of the dielectric layer 120. The patterned mask 140 can be formed by steps including (1) blanketly depositing a sacrificial layer to form the patterned mask 140 on the dielectric layer 120, (2) coating a photosensitive material on the sacrificial layer 120, (3) exposing and developing the photosensitive material to form a feature pattern, and (4) performing an etching process to remove portions of the sacrificial layer not covered by the feature pattern to expose the portions of the dielectric layer 120.

Figure 3A:
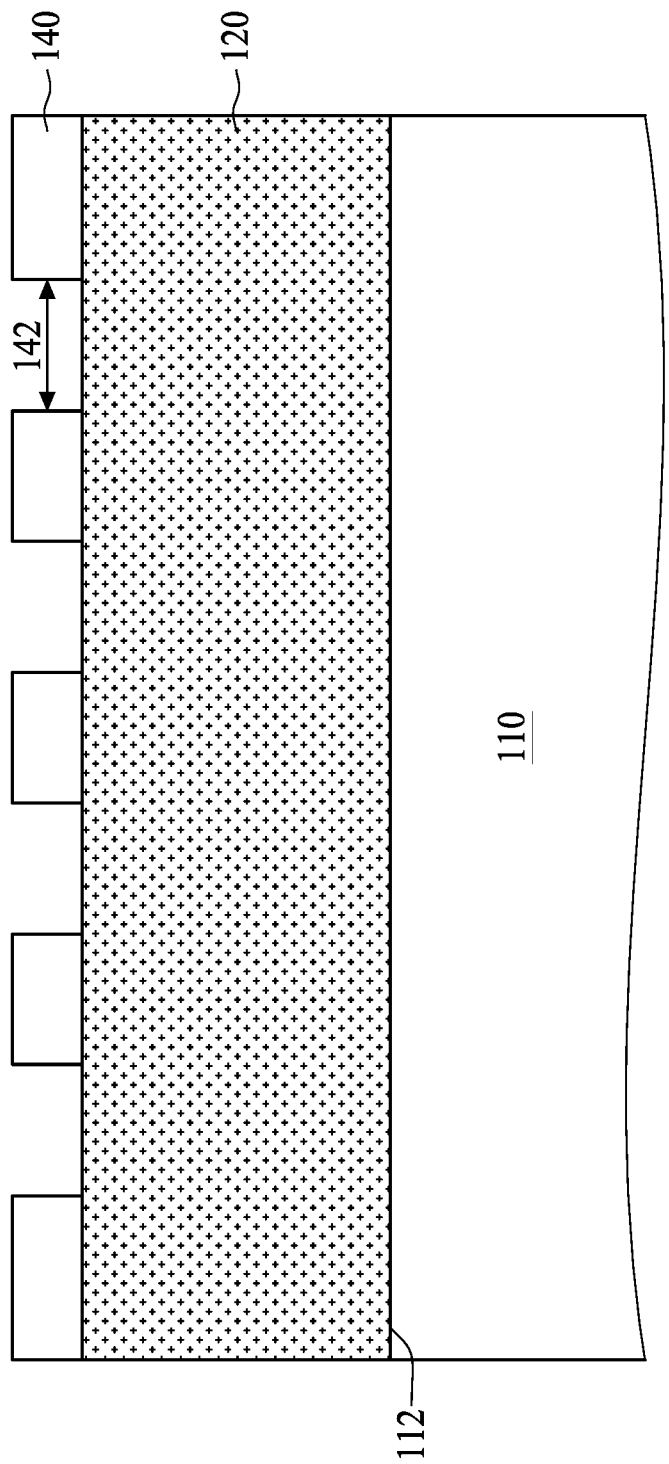
FIGS. 3A through 3D are cross-sectional views of intermediate stages in the formation of the comparative semiconductor device.
Figure 3B:
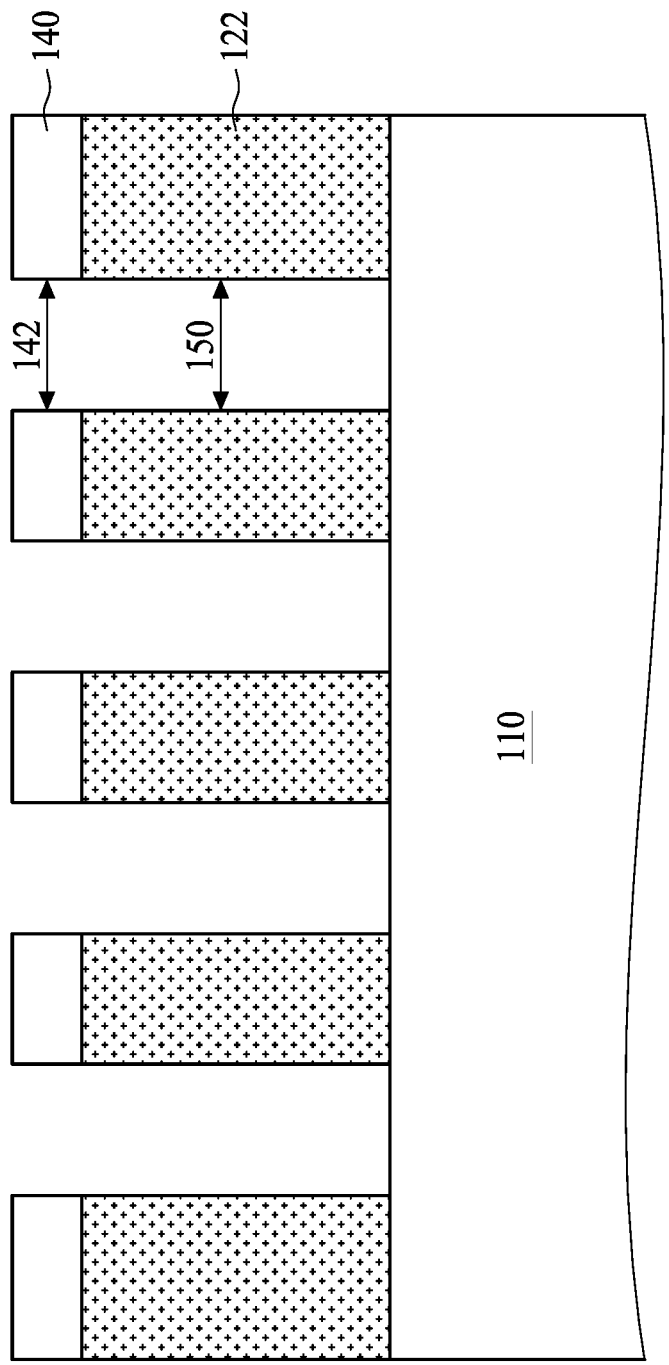

The method 20 then proceeds to the step S204, in which the trenches 150, as shown in FIG. 3B, are created. Referring to FIGS. 3A and 3B, the dielectric layer 120 can be anisotropically dry-etched, using a reactive ion etching (RIE) process, for example, through the windows 142 to form the trenches 150, so that a width of the windows 142 is maintained in the trenches 150. The trenches 150, shown in FIG. 3B, penetrate through the remaining dielectric layer 122 to expose portions of the semiconductor substrate 110. After the formation of the trenches 150, the patterned mask 140 is removed using a wet strip process, for example.

Figure 3C:
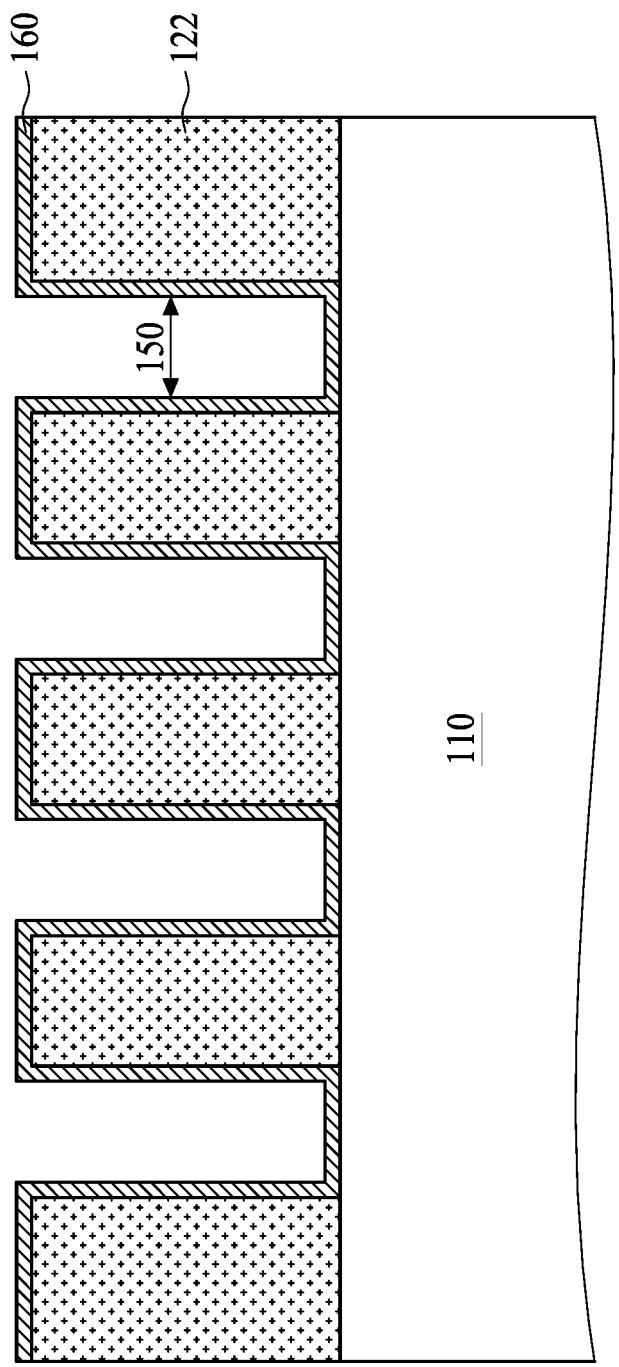

After the formation of the trenches 150, the method 20 proceeds to the step S206, in which the diffusion barrier layer 160 is deposited in the trench 150, as shown in FIG. 3C. The diffusion barrier layer 160, having a substantially uniform thickness, covers portions of the semiconductor substrate 110 exposed through the trenches 150 and the remaining dielectric layer 122, but does not fill the trenches 150. The diffusion barrier layer 160 includes at least one refractory metal, such as tantalum or titanium.

Figure 3D:
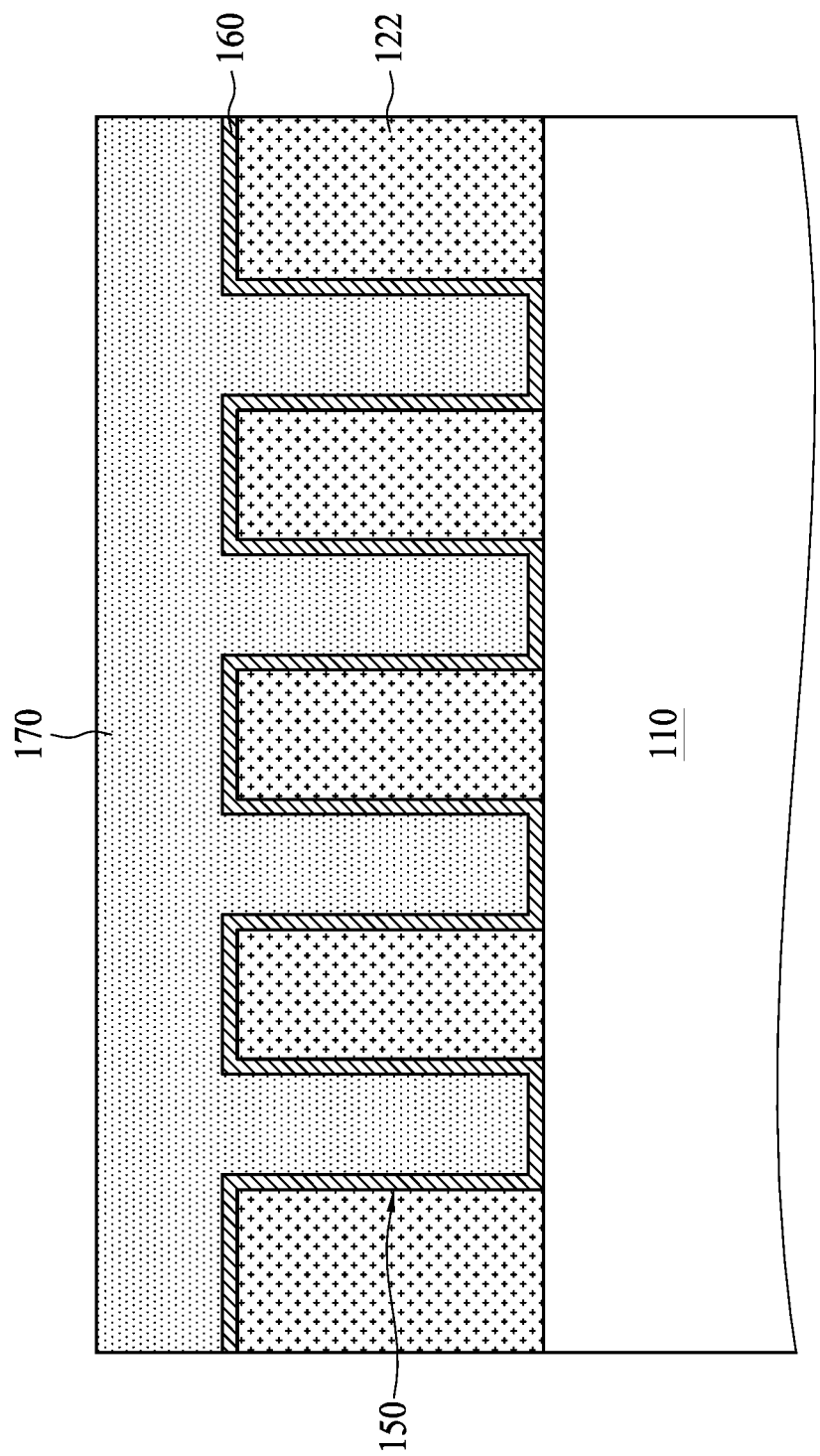

The method 20 then proceeds to the step S208, in which the plating process is performed to fill the trenches 150 with the conductive material 170, as shown in FIG. 3D. The conductive material 170 can be conformally and uniformly deposited, by way of an electroplating process, for example, on the diffusion barrier layer 160 until the trenches 150 are completely filled. The conductive material 170 can include copper, aluminum, or the like.

Next, the method 20 proceeds to the step S210, in which at least one removal process is performed to remove the conductive material 170 and the diffusion barrier layer 160 overflowing the trenches 150, thereby exposing the remaining dielectric layer 122. Consequently, interconnection structures 130 including a conductive feature 132 and a diffusion barrier liner 134 are formed, and thus the comparative semiconductor device 10, shown in FIG. 1, is formed.

When the metal design rules are scaled down, the size of the interconnect structures 130 is reduced, thus increasing an aspect ratio of the trenches 150 in which the interconnect structures 130 are to be formed. When the aspect ratio of the trenches 150 is increased, it is difficult to fill the trenches 150 with the diffusion barrier layer 160 and the conductive material 170. It is found that metal coverage in the bottom of the trenches 150 is reduced to less than ten percent due to the high aspect ratio, and an undercut may be formed. Further, it is found that the interconnect structures 130 suffer from even lower step coverage at the bottom and corners of the trenches 150, and thus it may be observed that the interconnect structures 130 have a discontinuous configuration. It should be realized that a resistance of the interconnect structures 130 having the undercut or the discontinuous configuration is increased, and the reliability of the interconnect structures 130 and performance of the entire circuit are therefore reduced. Therefore, there is a need for a method other than the damascene method described in FIG. 2 to manufacture reliable interconnect features having high aspect ration and high density.

Figure 4A:
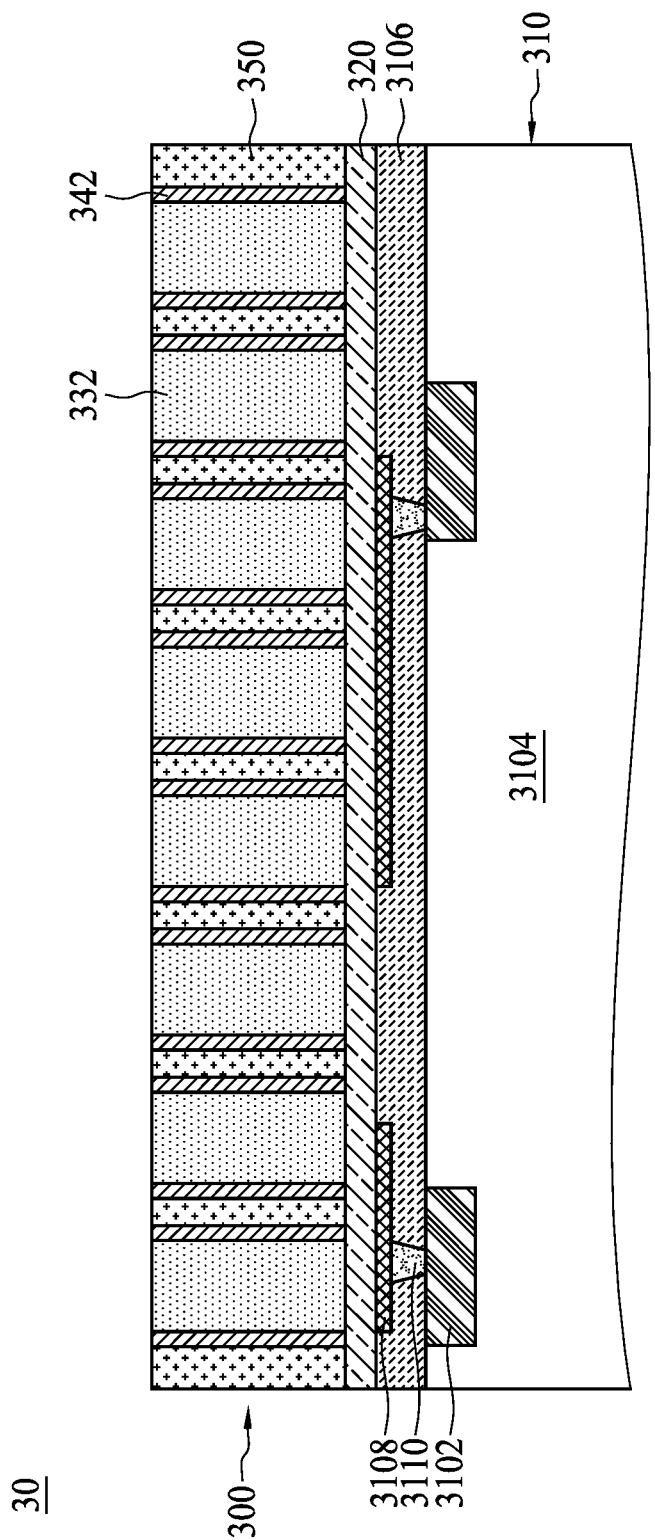
FIGS. 4A and 4B are cross-sectional views of a semiconductor device in accordance with some embodiments of the present disclosure.

FIG. 4A is a cross-sectional view of a semiconductor device 30 in accordance with some embodiments of the present disclosure. Referring to FIG. 4A, the semiconductor device 30 includes an interconnect structure 300 disposed on a substrate 310. The interconnect structure 300 includes a diffusion barrier layer 320 disposed on the substrate 310, a passivation layer 350 disposed on the diffusion barrier layer 320, and a plurality of conductive features 332 penetrating through the passivation layer 350 and contacting the diffusion barrier layer 320.

The substrate 310 can include one or more main components 3102 formed in or on a semiconductor wafer 3104, a dielectric layer 3106 covering the semiconductor wafer 3104 and the main components 3102, a metal wiring layer 3108 (i.e., metallization level M1) surrounded by the dielectric layer 3106, and one or more (conductive) plugs 3110 disposed in the dielectric layer 3106 to connect the main components 3102 to the wiring layer 3108. In some embodiments, the main components 3102 and the plugs 3110 are formed in FEOL processes, and the wiring layer 3108 may be formed in BEOL processes.

The diffusion barrier layer 320, having a substantially uniform thickness, covers the dielectric layer 3106 and the wiring layer 3108. In some embodiments, the diffusion barrier layer 320, between the dielectric layer 3106 and the conductive features 332, is employed to prevent the conductive feature 332 from flaking or spalling from the dielectric layer 3106, so that the footprint for the formation of the conductive features 332 can be increased. In some embodiments, the diffusion barrier layer 320 can be patterned to create a specific route for electrically connecting the main components 3102.

The semiconductor device 30 further includes a plurality of insulative liners 342 interposed between conductive features 332, arranged in an equally-spaced configuration, and the passivation layer 350. The insulative liners 342 function as a sealing layer to prevent the metal in the conductive features 332 from diffusing into the passivation layer 350. The insulative liners 342 and the passivation layer 350 are silicon-containing dielectrics. In some embodiments, the passivation layer 350 has a first dielectric constant, and the insulative liners 342 have a second dielectric constant greater than the first dielectric constant. For example, the passivation layer 350 includes silicon oxide or silicon dioxide, and the insulative liners 342 include silicon carbide or silicon nitride.

Figure 4B:
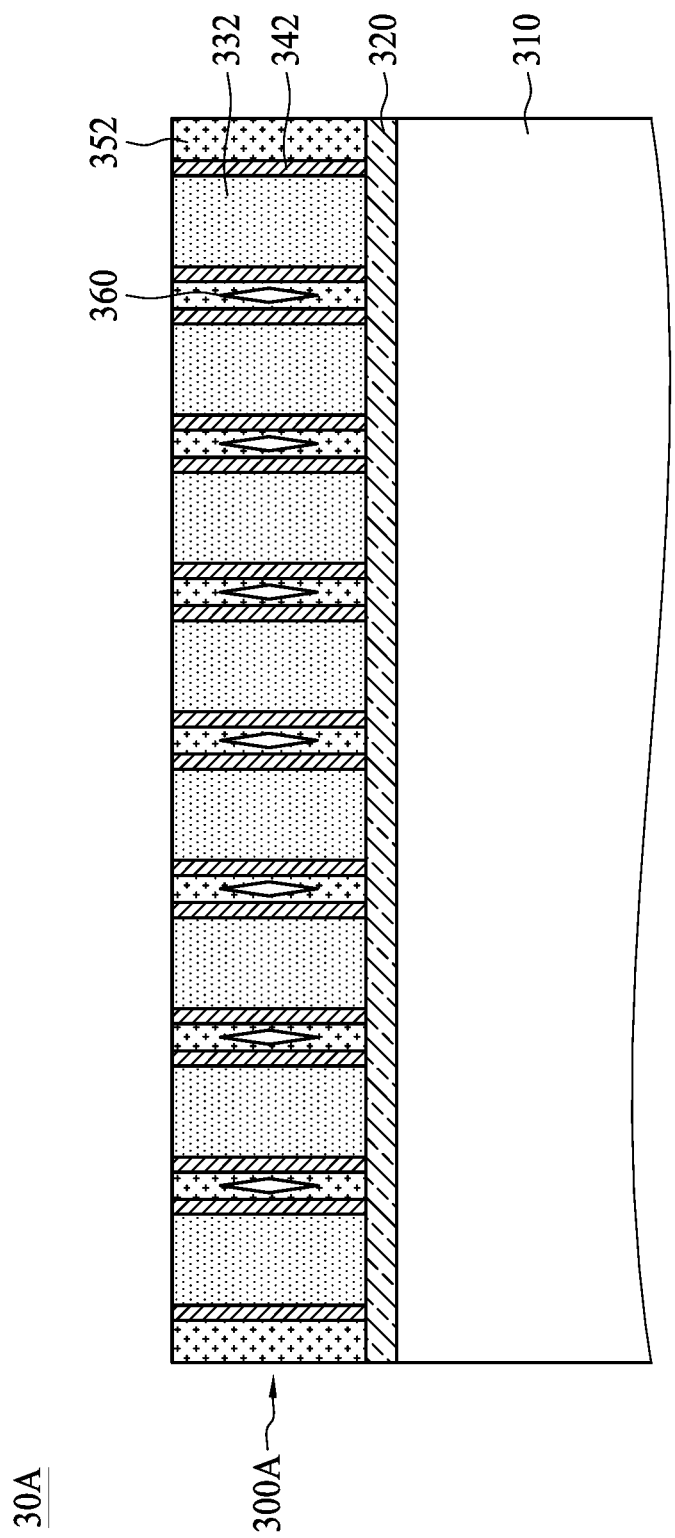

FIG. 4B is a cross-sectional view of a semiconductor device 30A in accordance with some embodiments of the present disclosure. Referring to FIG. 4B, the semiconductor device 30A includes an interconnect structure 300A disposed on a substrate 310. The interconnect structure 300A includes a diffusion barrier layer 320 disposed on the substrate 310, a plurality of conductive features 332 disposed on the diffusion barrier layer 320, a passivation layer 352 enclosing the conductive features 332, a plurality of insulative liners 342 disposed between conductive features 332, and a plurality of voids 360, holding an ambient gas (such as air), buried in the passivation layer 352.

The insulative liners 342, enclosing the conductive features 332, and the passivation layer 352, which the conductive features 332 and the insulative liners 342 penetrate, have different dielectric constants. The void 360 holds air, which has a dielectric constant or k value of about 1, and which can reduce an effective dielectric constant of the passivation layer 350. Therefore, RC delay of the interconnect structure 300A can be reduced and the speed of the signal transmission through the interconnect structure 300A is thus increased, wherein the RC delay is defined by the product of a resistance (R) of the conductive features 332 and a capacitance (C) between the conductive features 332 and the dielectric layer between the conductive features 332.

Figure 5:
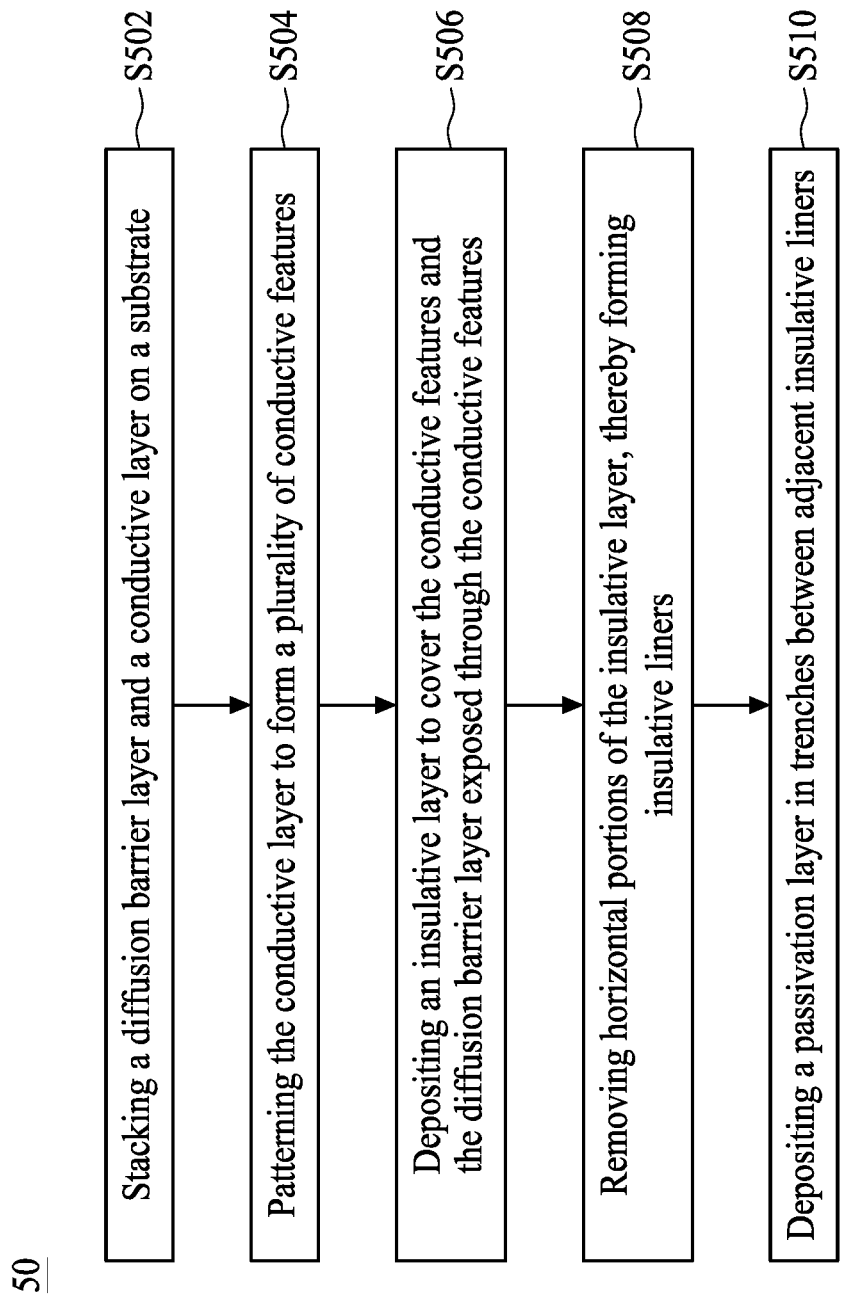
FIG. 5 is a flow diagram illustrating a method of manufacturing a semiconductor device in accordance with some embodiments of the present disclosure.

FIG. 5 is a flow diagram illustrating a method 50 of manufacturing a semiconductor device 30 in accordance with some embodiments of the present disclosure, and FIGS. 6 through 12 illustrate cross-sectional views of intermediate stages in the formation of the semiconductor device 30 in accordance with some embodiments of the present disclosure. The stages shown in FIGS. 6 to 12 are referred to in the flow diagram in FIG. 5. In the following discussion, the fabrication stages shown in FIGS. 6 to 12 are discussed in reference to the process steps shown in FIG. 5.

Figure 6:
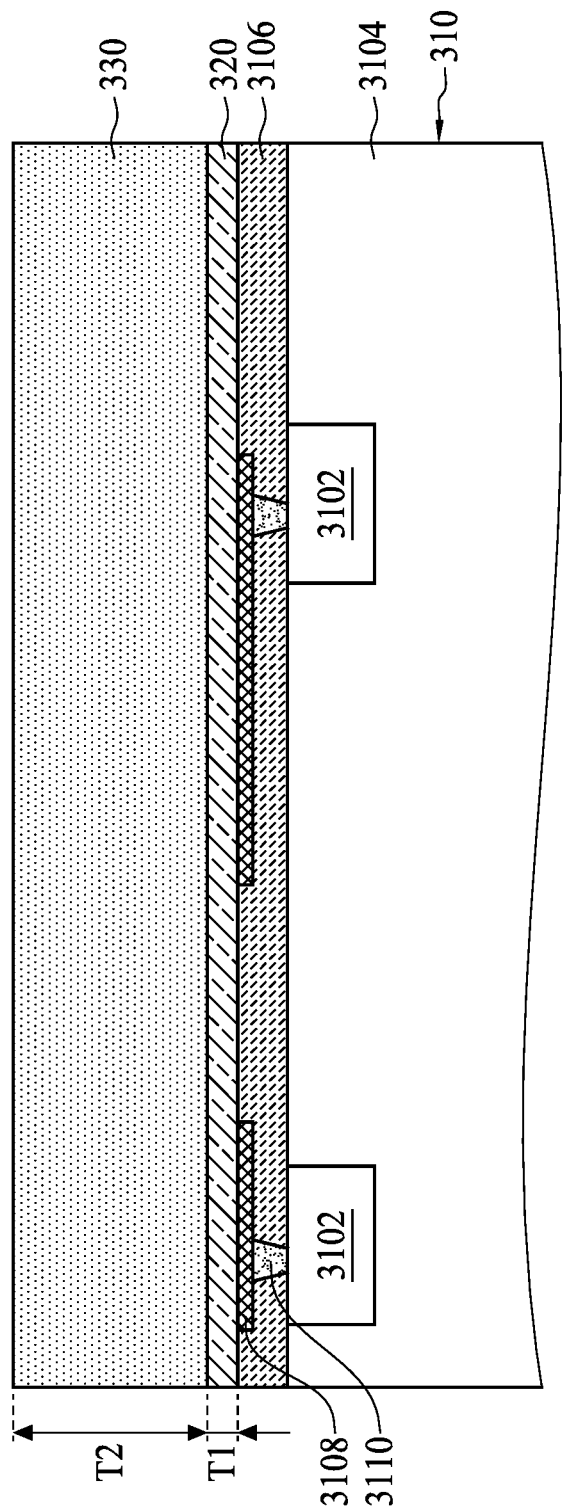
FIG. 6 is a cross-sectional view of an intermediate stage in the formation of the semiconductor device in accordance with some embodiments of the present disclosure.

Referring to FIG. 6, a diffusion barrier layer 320 and a conductive layer 330 are sequentially stacked on a substrate 310 according to a step S502 in FIG. 5. The substrate 310 includes a semiconductor wafer 3104 and one or more main components 3102 disposed in or on the semiconductor wafer 3104. The semiconductor wafer 3104 can be made of silicon. Alternatively or additionally, the semiconductor wafer 3104 may include other elementary semiconductor materials such as germanium. In some embodiments, the semiconductor wafer 3104 is made of a compound semiconductor such as silicon carbide, gallium arsenic, or indium phosphide. In some embodiments, the semiconductor wafer 3104 is made of an alloy semiconductor such as silicon germanium or silicon germanium carbide, gallium arsenic phosphide, or gallium indium phosphide. In some embodiments, the semiconductor wafer 3104 can include an epitaxial layer. For example, the semiconductor wafer 3104 has an epitaxial layer overlying a bulk semiconductor.

The semiconductor wafer 3104 can include various doped regions (not shown) doped with p-type dopants, such as boron, and/or n-type dopants, such as phosphorus or arsenic. In some embodiments, isolation features (not shown), such as shallow trench isolation (STI) features or local oxidation of silicon (LOCOS) features, can be introduced in the semiconductor wafer 3104 to define and isolate various main components 3102 in the semiconductor wafer 3104. The main components 3102 may be formed in active areas (not shown) defined by the isolation features.

The main feature 3102 can include active components, such as transistors and/or diodes, and passive components, such as capacitors, resistors or the like. The main components 3102 are formed using various processes including deposition, etching, implantation, photolithography, annealing, and or other applicable processes. In some embodiments, the main components 3102 may be formed in the semiconductor wafer 3104 during front-end-of-line (FEOL) processes.

The substrate 310 further includes a dielectric layer 3106, a wiring layer 3108, and one or more plugs 3110 formed over the semiconductor wafer 3102 and the main components 3104. The plugs 3110 and the wiring layers 3108 are sequentially formed in the dielectric layer 3106 using conventional damascene processes.

After the formation of the wiring layer 3108 in the substrate 310, the diffusion barrier layer 320 is deposited on the substrate 310 to cover the dielectric layer 3106 and the wiring layers 3108. The diffusion barrier layer 320 can be deposited on the substrate 310 using a chemical vapor deposition (CVD) process or a physical vapor deposition (PVD) process, for example. In some embodiments, after the deposition of the diffusion barrier layer 320, a planarizing process can be optionally performed on the diffusion barrier layer 320 to yield an acceptably flat topology. The diffusion barrier layer 320 can be optionally patterned to create a specific route for electrically connecting the main components 3102. The diffusion barrier layer 320 can be patterned using at least one photolithography process to expose portions of the dielectric layer 3106 and the wiring layer 3108. After the patterning of the diffusion barrier layer 320, an insulative material is deposited to cover the exposed dielectric layer 3106 and the wiring layer 3108 to prevent short circuit. The diffusion barrier layer 320 can be a single-layered structure including refractory metals (such as tantalum and titanium), refractory metal nitrides, or refractory metal silicon nitrides. Alternatively, the diffusion barrier layer 320 may be a multi-layered structure including two or more refractory metals, refractory metal nitrides, or refractory metal silicon nitrides.

The conductive layer 330 is conformally formed on the diffusion barrier layer 320, so that the diffusion barrier layer 320 is buried in the conductive layer 330. The conductive layer 330 is formed using a CVD process, a plating process or another suitable process. The conductive layer 330 can include copper, aluminum, or the like. In some embodiments, after the deposition of the conductive layer 330, a planarizing process can be performed on the conductive layer 330 to yield an acceptably flat topology. As shown in FIG. 6, the diffusion barrier layer 320 has a first thickness T1, and the conductive layer 330 has a second thickness T2 greater than the first thickness T1. In some embodiments, the second thickness T2 is less than 40 nm. For example, the second thickness T2 is about 35 nm.

Next, the conductive layer 330 is patterned to form a plurality of conductive features 340 according to a step S504 in FIG. 5. The conductive layer 330 can be patterned using two exposure processes and a develop process on a photosensitive material 410 to form a target pattern 410a on the conductive layer 330, and an etching process on the conductive layer 330 using the target pattern 410a as a mask to form the conductive features 332, as described with reference to FIGS. 7A to 7D below. Alternatively, the conductive layer 330 can be patterned to form the conductive features 332 using two photolithography processes, as described with reference to FIGS. 8A to 8G below.

Figure 7A:
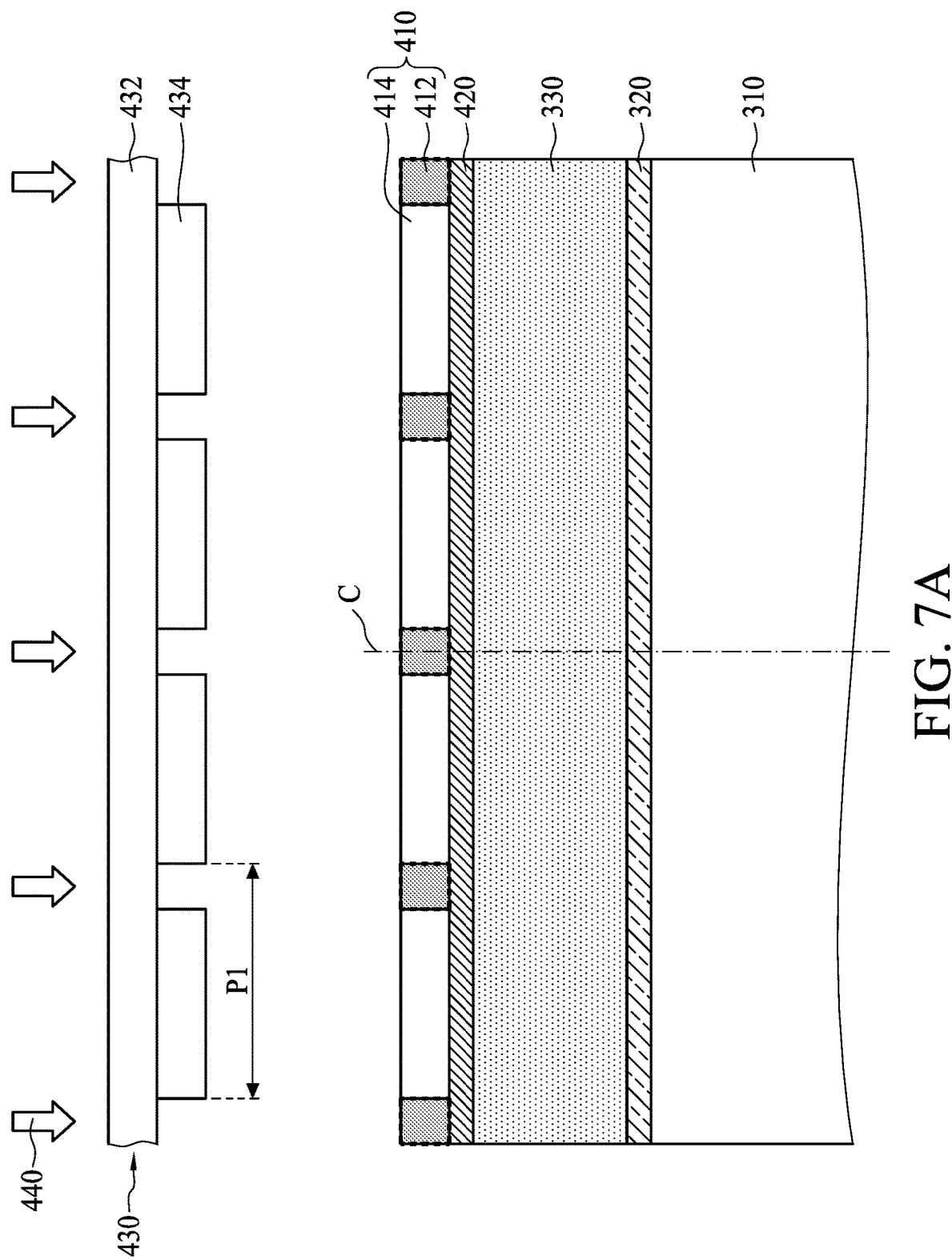
FIGS. 7A through 7D are cross-sectional views of intermediate stages in the formation of the semiconductor device in accordance with some embodiments of the present disclosure.

Referring to FIG. 7A, after the formation of the conductive layer 330, a photosensitive layer 410 is applied on the conductive layer 330 by a spin-coating process and then dried using a soft-baking process. The soft-baking process can remove solvent from the photosensitive layer 410, fully cover the conductive layer 330, and harden the photosensitive layer 410.

In some embodiments, an antireflective coating (ARC) layer 420 can be optionally deposited on the conductive layer 330 prior to the formation of the photosensitive layer 410 to minimize the optical reflection of the radiation used to expose the photosensitive layer 410. The ARC layer 420 can be formed of an inorganic material, including nitride, using a CVD process, a spin-coating process or another suitable process.

Next, a mask 430, including a plate 432 and a geometric pattern attached to the plate 432, is provided. The plate 432 can be made of glass or quartz, and the geometric pattern includes a plurality of lines 434 arranged in an equally-spaced configuration; that is, the geometric pattern is a line-and-space pattern. The geometric pattern has a minimum pitch P that is achievable with current photolithographic equipment, wherein the pitch P represents a length including one line 434 and one space between adjacent lines 434. In some embodiments, the pitch P is less than 70 nm. For example, the pitch P is about 64 nm. As shown in FIG.

7A, a central axis C of the substrate 310 is aligned with one of the spaces between two adjacent lines 434 of the mask 430.

Next, a first exposure process is performed to expose the photosensitive layer 410 to actinic radiation 440 through the mask 430, so that a duplicate of the geometric pattern appears in the photosensitive layer 410. After the first exposure process, the photosensitive layer 410 is comprised of a plurality of first exposed portions 412 and a plurality of unexposed portions 414.

Figure 7B:
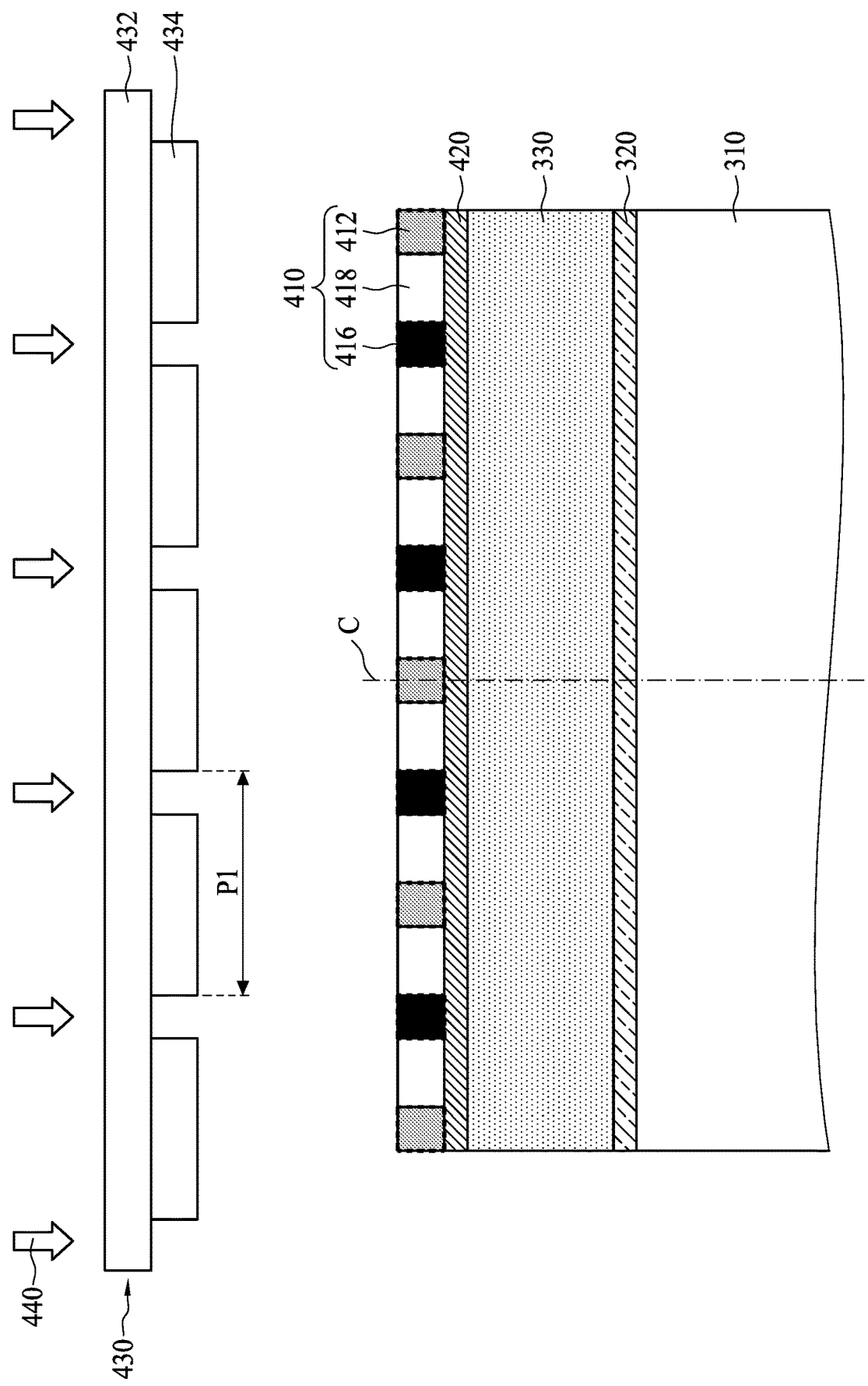

Referring to FIG. 7B, the mask 430 is shifted so that the central axis C of the substrate 310 is aligned with one of the lines 434 of the mask 430. A second exposure process is then performed to expose the unexposed portions 414 (shown in FIG. 7A) to actinic radiation 440 through the mask 430. Hence, the photosensitive layer 410 is comprised of the plurality of first exposed portions 412, a plurality of second exposed portions 416, and a plurality of unexposed portions 418.

Figure 7C:
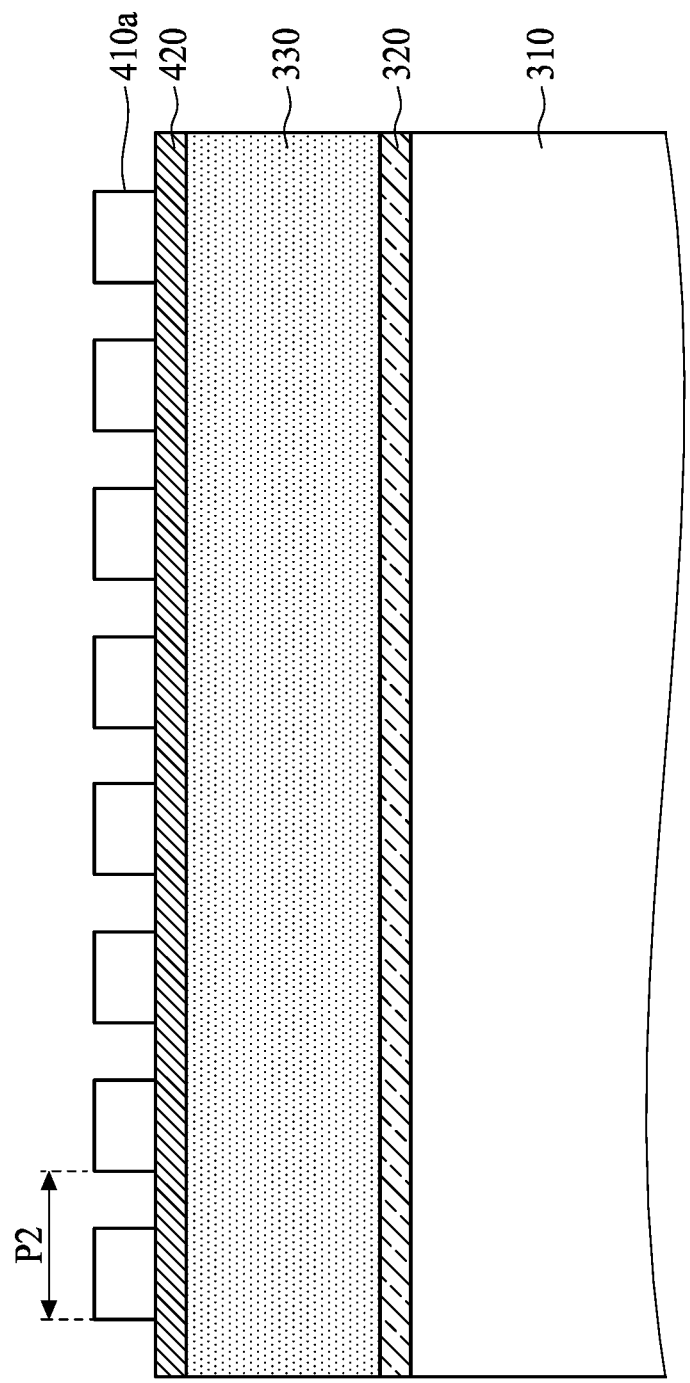

Referring to FIG. 7C, a developing process is performed to preferentially remove the first and second exposed portions 412 and 416 by the developer, such that the target pattern 410a for etching the conductive layer 330 is formed. The double exposure technique splits the unexposed portions 414 from the first exposed process into two complimentary portions during the performing of the second exposure process and creates the target pattern 410a having half-pitch unexposed portions 418. After the developing step, a post-baking process is performed to drive off the solvent from the target pattern 410a, and toughens and improves the adhesion of the target pattern 410a. In addition, a deep ultraviolet (UV) treatment (baking the target pattern 410a at about 150 to 200 degrees Celsius in UV light) can be used to further strengthen the target pattern 410a for better resistance against the subsequent etches.

Figure 7D:
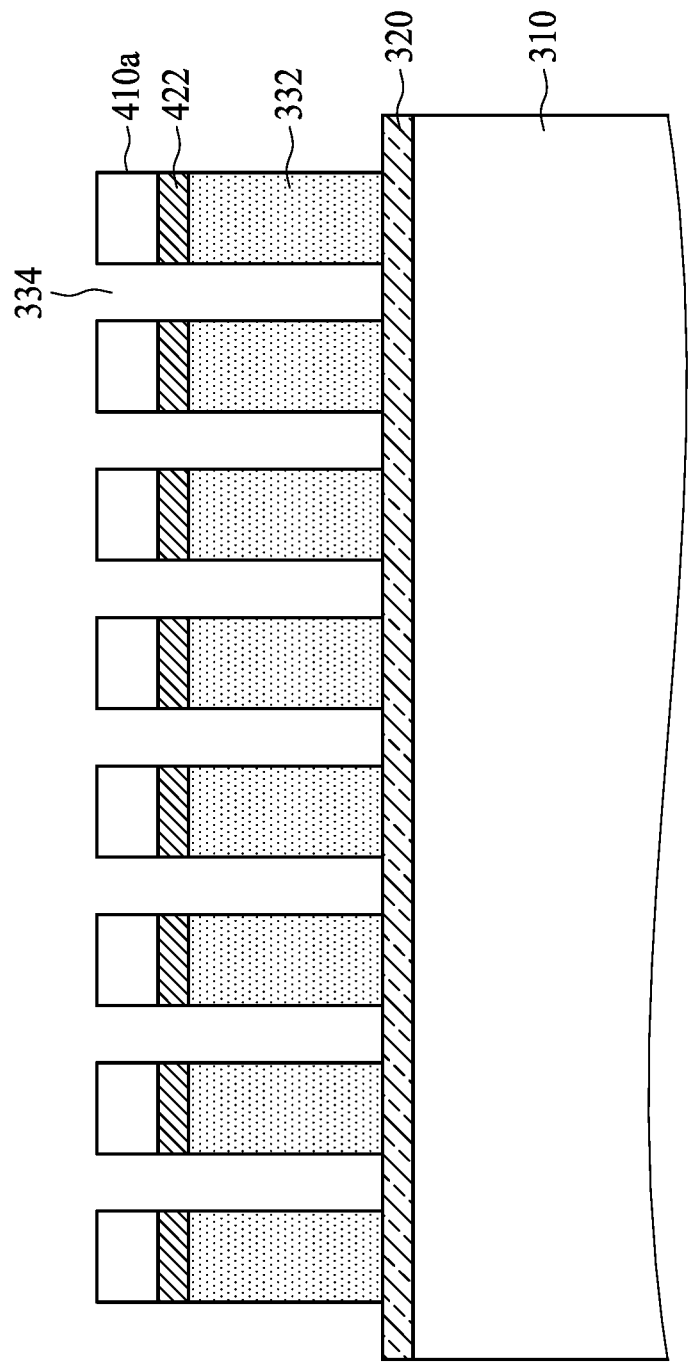

Referring to FIGS. 7C and 7D, at least one etching step is conducted to remove portions of the ARC layer 420 and the conductive layer 330 not covered by the target pattern 410a; therefore, a plurality of conductive features 332 are formed. The ARC layer 420 and the conductive layer 330 can be anisotropically dry-etched, using an RIE etching process, for example, so that the width of spaces between the unexposed portions 418 is maintained in trenches 334 between the conductive features 332. It should be noted that the etching step may utilize multiple etchants, selected based on the materials of the conductive layer 330 and the ARC layer 420, to sequentially etch the ARC layer 420 and the conductive layer 330. In some embodiments, the diffusion barrier layer 320 may serve as an etch-stop layer during the performing of the etching step.

After the formation of the conductive features 332, the target pattern 410a is removed using a stripping process, for example. In some embodiments, the target pattern 410a including photosensitive material can be removed using a wet stripping process. In the wet stripping process, the target pattern 410a made of the photosensitive material is dissolved by a solution such as acetone or strong acids. The remaining ARC layer 422 is then removed using a wet-etching process, for example.

Figure 8A:
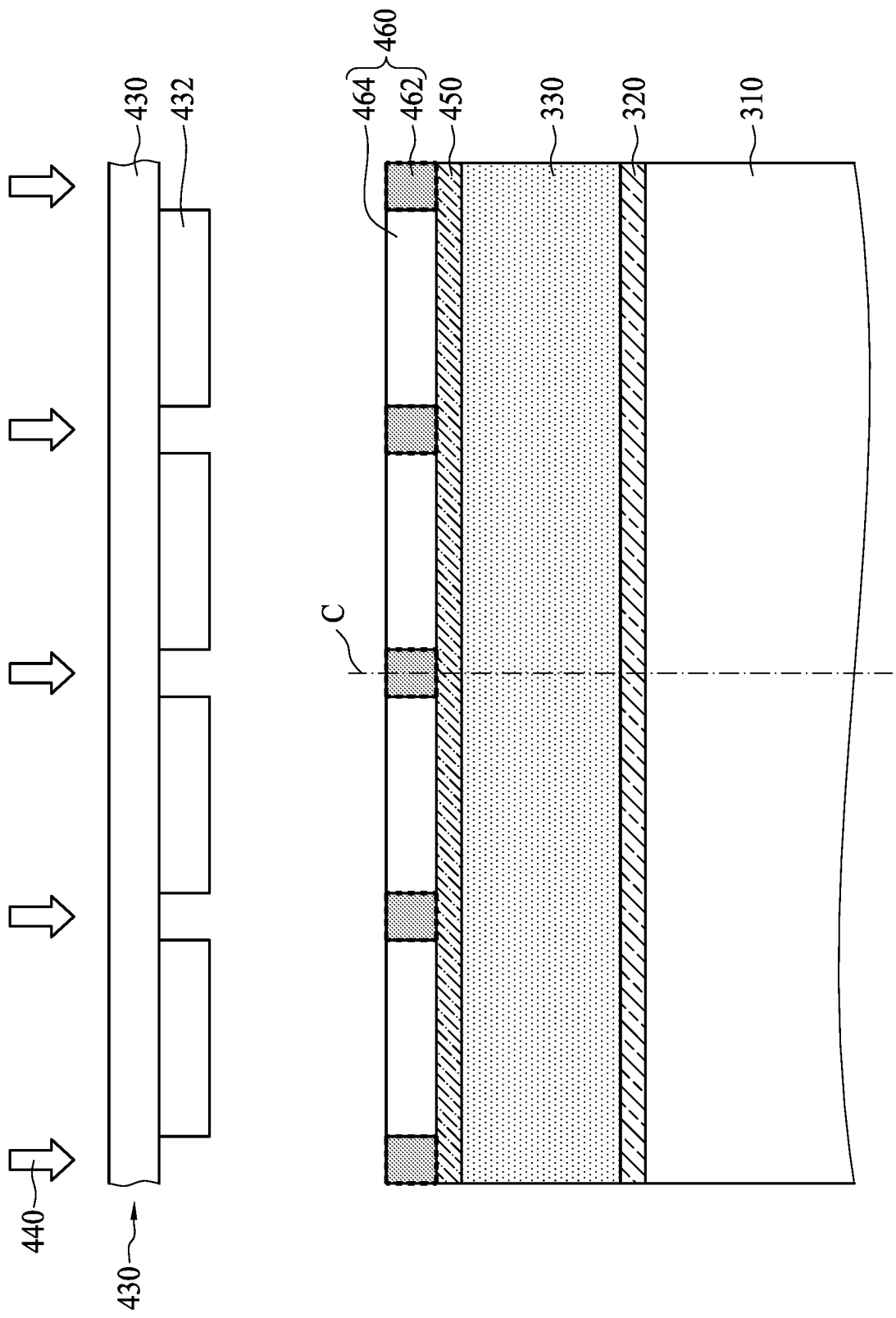
FIGS. 8A through 8G are cross-sectional views of intermediate stages in the formation of the semiconductor device in accordance with some embodiments of the present disclosure.

Referring to FIGS. 8A to 8G, another process for producing the conductive features 332 is disclosed. Referring to FIG. 8A, after the formation of the conductive layer 330, a sacrificial layer 450 is deposited on the conductive layer 330 using a CVD process, for example, and a first photosensitive layer 460 is applied on the conductive layer 330 by a spin-coating process and then dried using a soft-baking process.

Next, the mask 430 having the geometric pattern is provided, and a first exposure process is performed to expose the first photosensitive layer 460 to actinic radiation 440 through the mask 430. Consequently, the first photosensitive layer 460 is comprised of a plurality of exposed portions 462 and a plurality of unexposed portions 464.

Figure 8B:
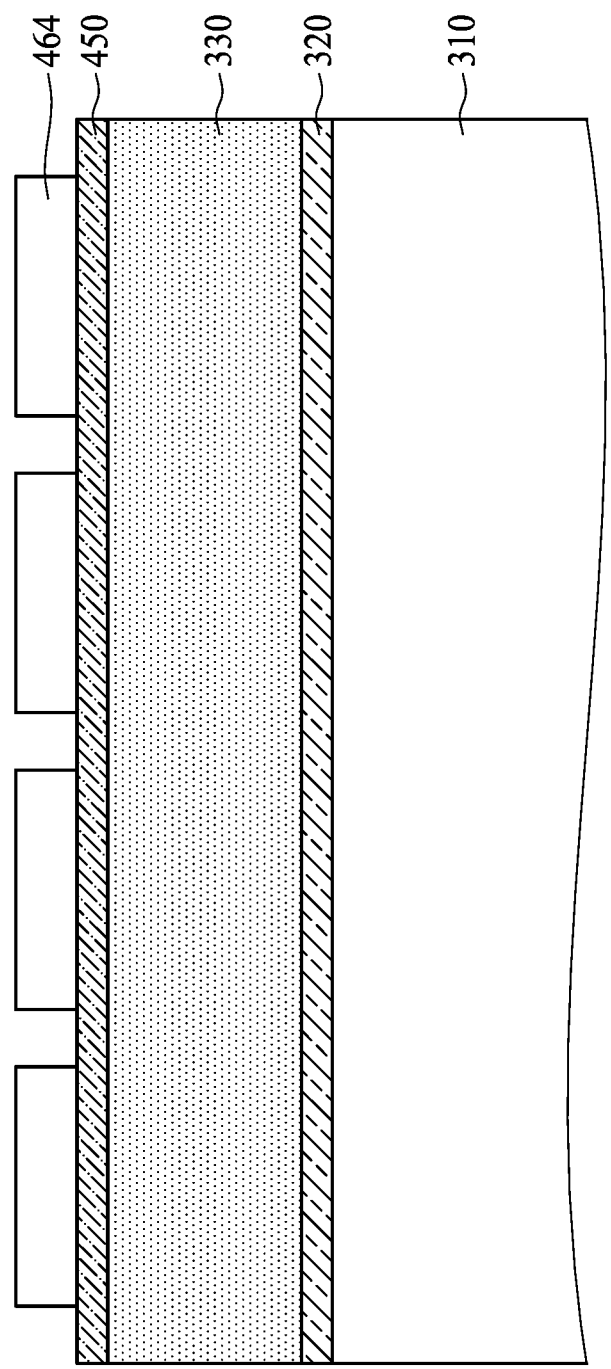

Referring to FIG. 8B, a first developing process is performed to remove the exposed portions 462 of the first photosensitive layer 460, while the unexposed portions 464 are left in place. The unexposed portions 464 of the first photosensitive layer 460 function as a mask for patterning the sacrificial layer 450.

Figure 8C:
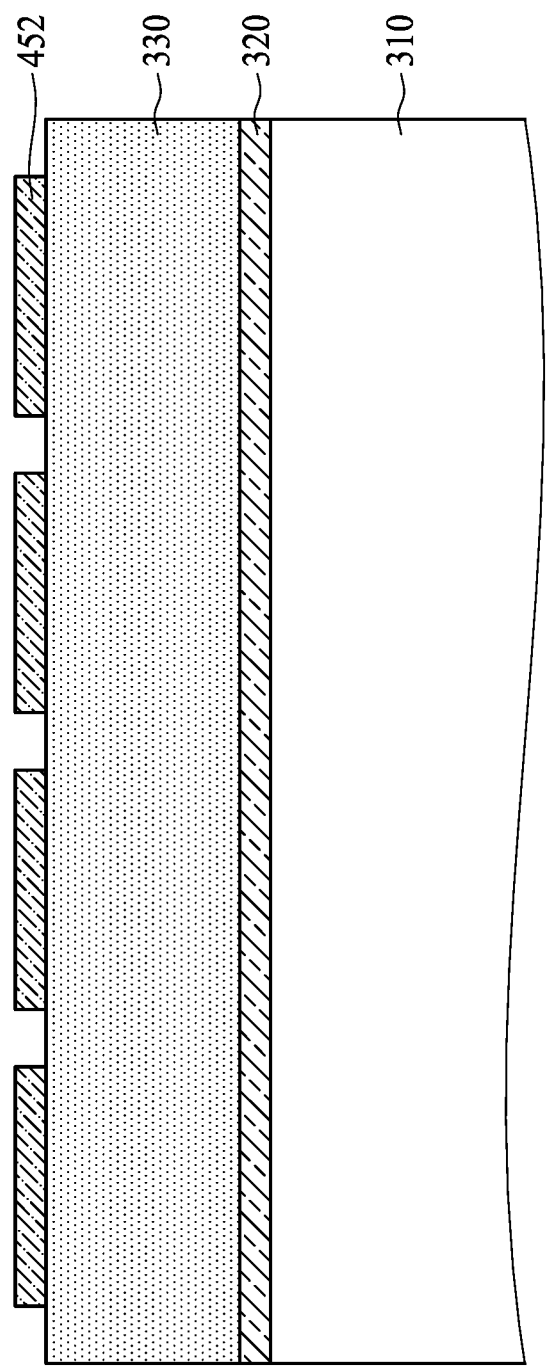

Referring to FIG. 8C, a first etching process is performed to remove portions of the sacrificial layer 450 not covered by the unexposed portions 464 of the first photosensitive layer 460. Consequentially, a plurality of sacrificial blocks 452 are formed. The conductive layer 330 serves as an etch-stop layer during the first etching process. After the performing of the first etching step, an ashing process or a wet strip process may be used to remove the first photosensitive layer 460, wherein the wet strip process may chemically alter the first photosensitive layer 460 so that it no longer adheres to the sacrificial blocks 452.

Figure 8D:
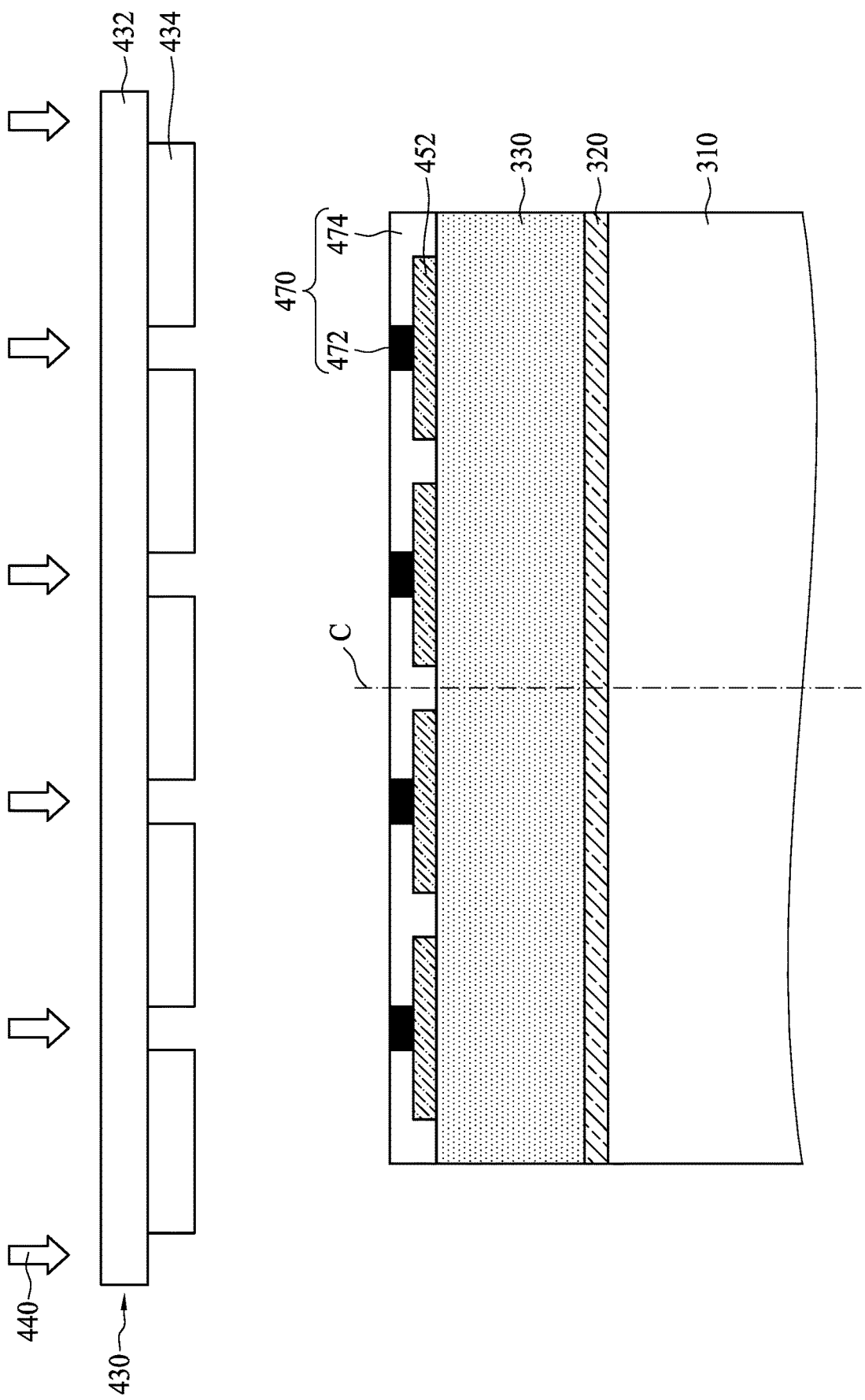

Referring to FIG. 8D, after the formation of the sacrificial blocks 452, a second photosensitive layer 470 is applied on the sacrificial blocks 452 and in spaces between adjacent sacrificial blocks 452. Next, the mask 430 is shifted to make the central axis C of the substrate 310 be aligned to one of the lines 434 of the mask 430.

A second exposure process is then performed to expose the second photosensitive layer 470 to actinic radiation 440 through the mask 430. Consequentially, the second photosensitive layer 470 is comprised of a plurality of exposed portions 472 and a plurality of unexposed portions 474.

Figure 8E:
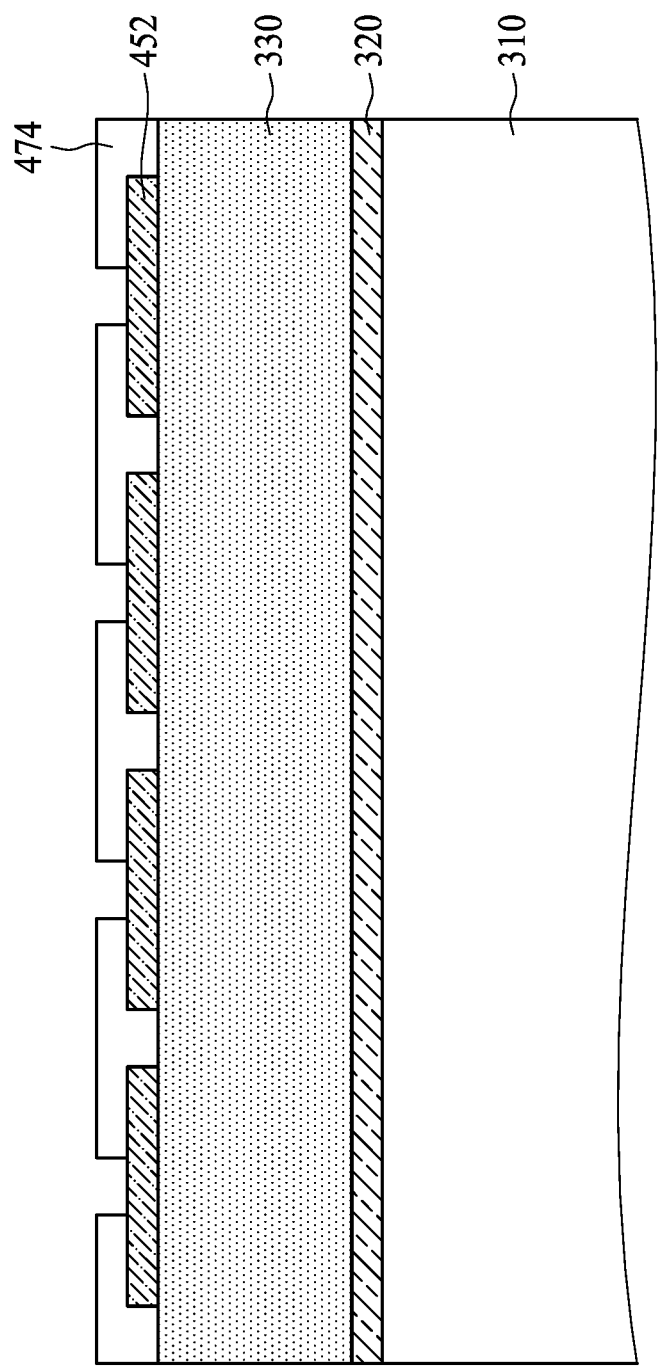

Referring to FIG. 8E, a second developing process is performed to remove the exposed portions 472 of the second photosensitive layer 470, while the unexposed portions 474 are left in place. The unexposed portions 474 of the second photosensitive layer 470 function as a mask for patterning the sacrificial block 452.

Figure 8F:
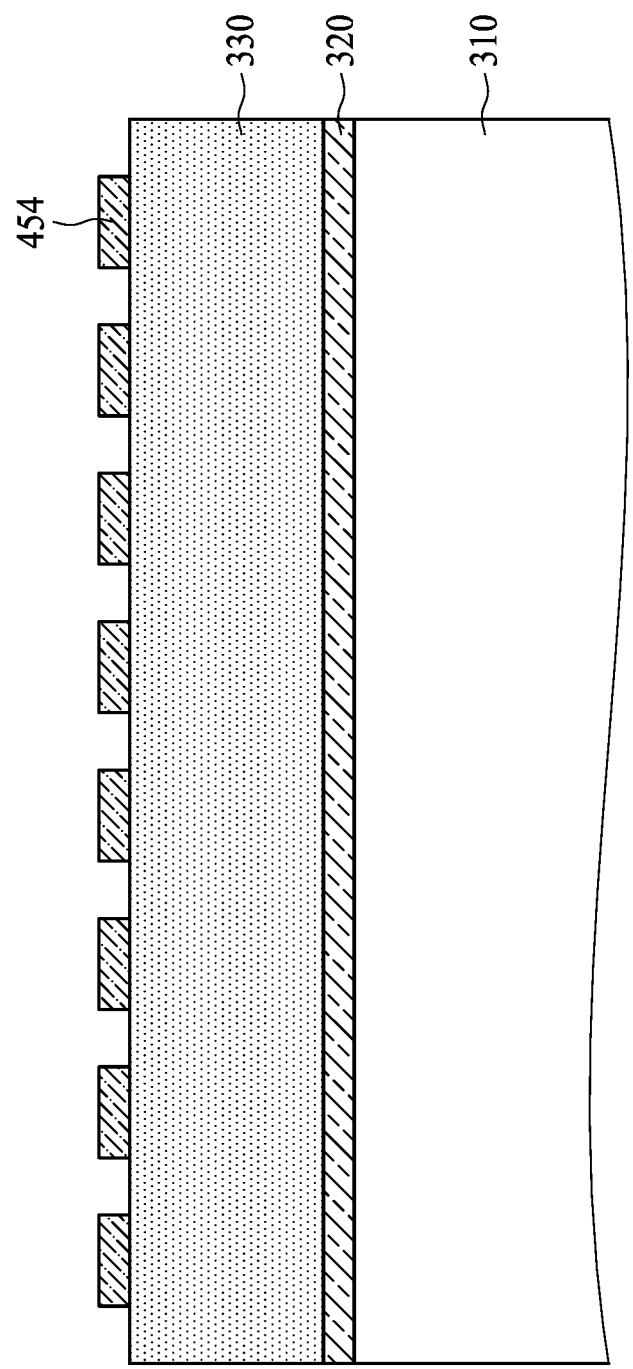

Referring to FIG. 8F, a second etching step is conducted to remove portions of the sacrificial block 452 exposed through the unexposed portions 474 of the second photosensitive layer 470, thereby forming a target pattern 454 for pattern the conductive layer 330. The conductive layer 330 serves as an etch-stop layer during the second etching process as well. After the performing of the second etching process, the unexposed portions 474 of the second photosensitive layer 470, as shown in FIG. 8E, are removed using an ashing process or a wet strip process, for example.

Figure 8G:
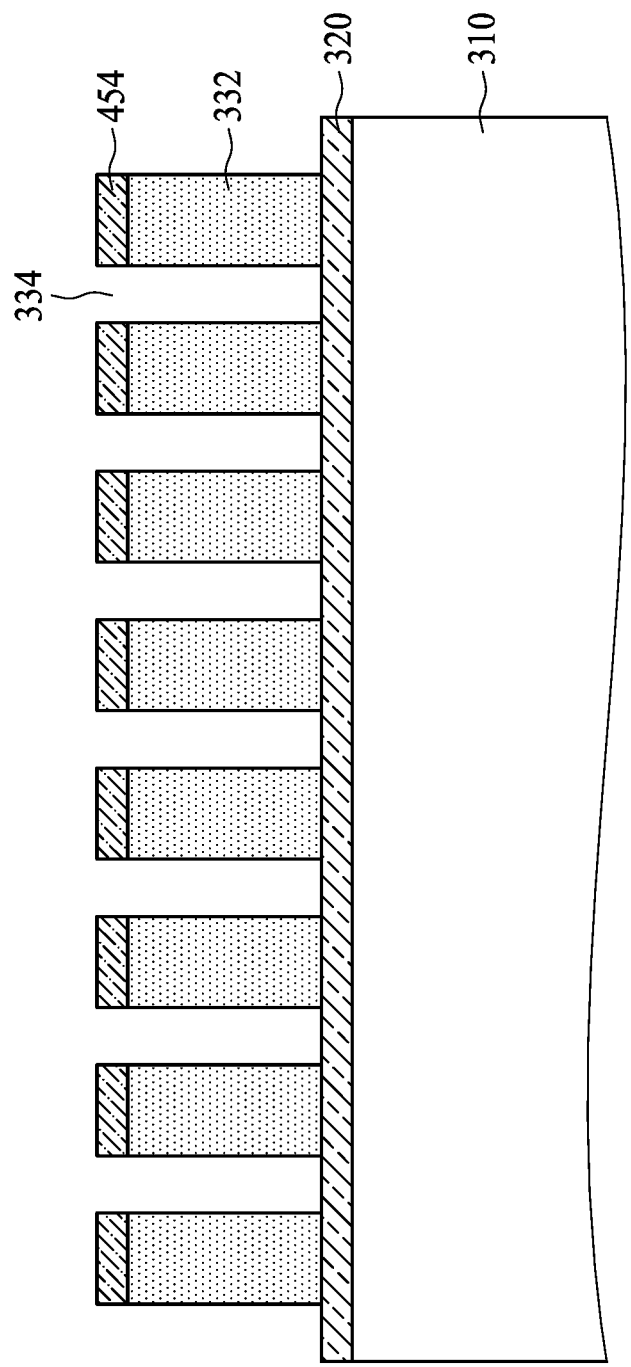

Referring to FIG. 8G, a third etching process is performed to remove portions of the conductive layer 330 not covered by the target pattern 454. Hence, the plurality of conductive features 332 are formed. The conductive layer 330 can be anisotropically dry-etched, using an RIE etching process, for example, so that the width of spaces in the target pattern 454 is maintained in trenches 334 between the conductive features 332. The diffusion barrier layer 320 serves as an etch-stop layer during the third etching process. The target pattern 454 is removed using a suitable process after the formation of the conductive features 332.

Figure 9:
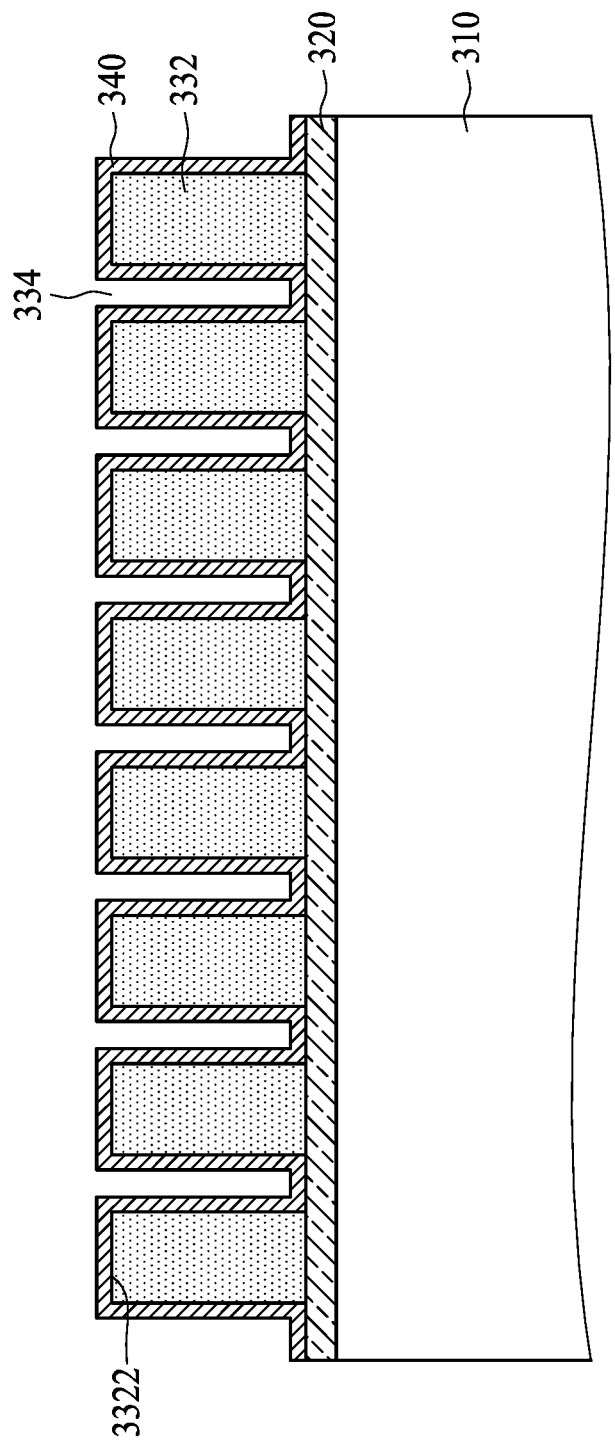
FIGS. 9 through 12 are cross-sectional views of intermediate stages in the formation of the semiconductor device in accordance with some embodiments of the present disclosure.

Referring to FIG. 9, after the formation of the conductive features 332, an insulative layer 340 is deposited to cover the conductive features 332 and the diffusion barrier layer 320 exposed through the conductive features 332 according to a step S506 in FIG. 5. The insulative layer 340 can have a uniform thickness. In other words, the insulative layer 340 has a topology following the topology of the exposed diffusion barrier layer 320 and the conductive features 332. For example, the insulative layer 340 including silicon-containing dielectric, such as silicon carbide or silicon nitride, can be deposited using a CVD process, an ALD process, a high-density plasma CVD process or the like.

Figure 10:
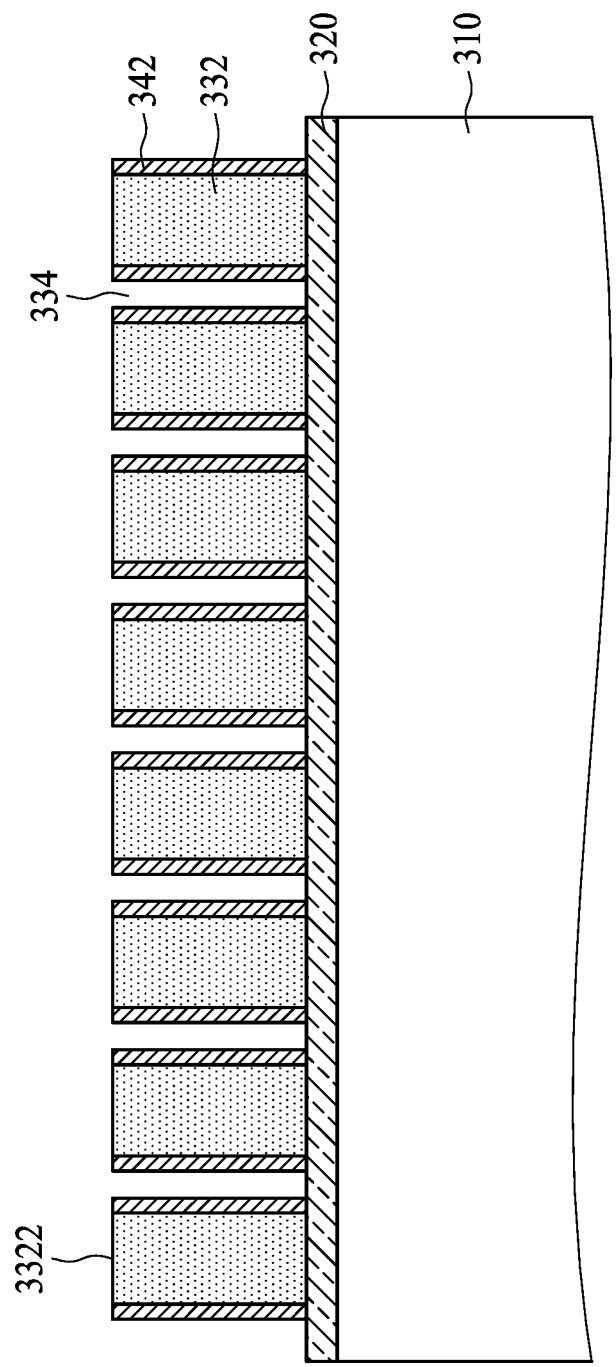

Referring to FIG. 10, portions of the insulative layer 340 covering the diffusion barrier layer 320 and topmost surfaces 3322 of the conductive features 332 are removed using an etching process according to a step S508 in FIG. 5. Consequentially, a plurality of insulative liners 342 are formed in the trenches 334, wherein the conductive features 332 are surrounded by the insulative liners 342. Specifically, an anisotropic etching process is performed to remove horizontal portions of the insulative layer 340, while the vertical portions of the insulative layer 340 are left on the conductive features 332. The chemistry of the anisotropic etching process can be selective to the material of the insulative layer 340. In other words, no substantial quantity of the material of the conductive layer 330 is removed during the etching of the horizontal portions of the insulative layer 340.

Figure 11:
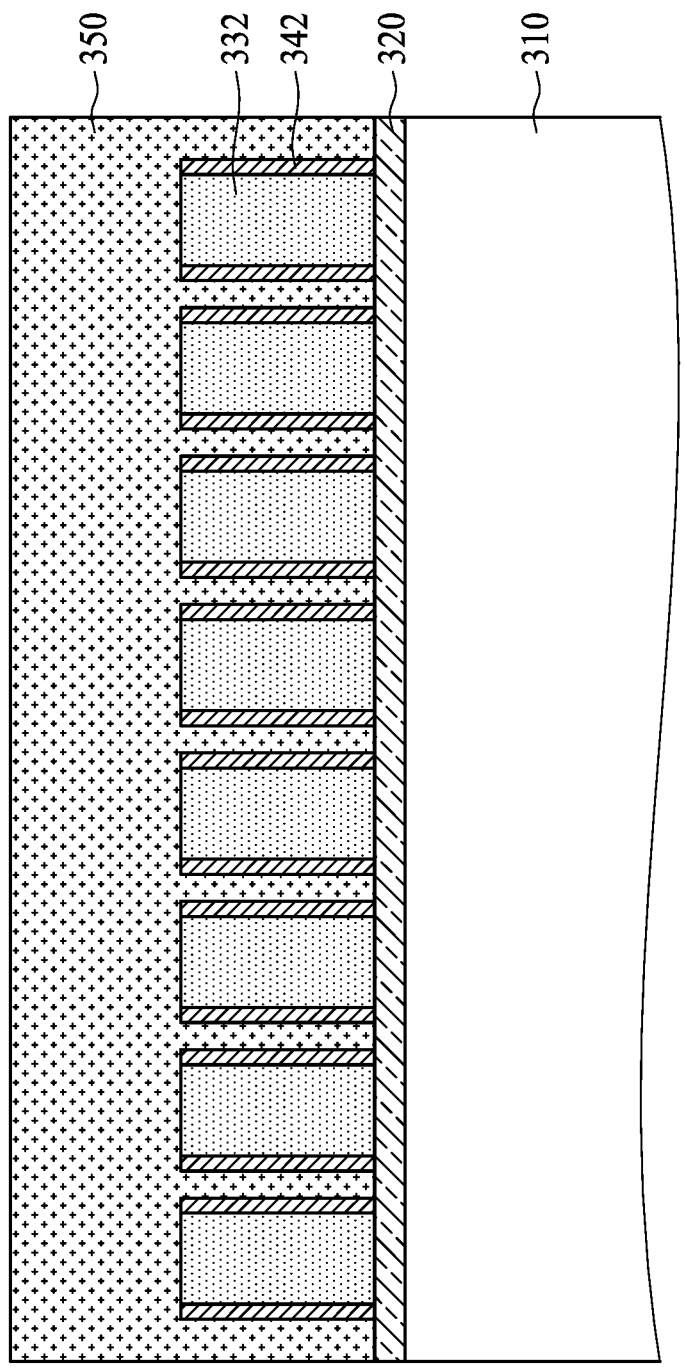
Figure 12:
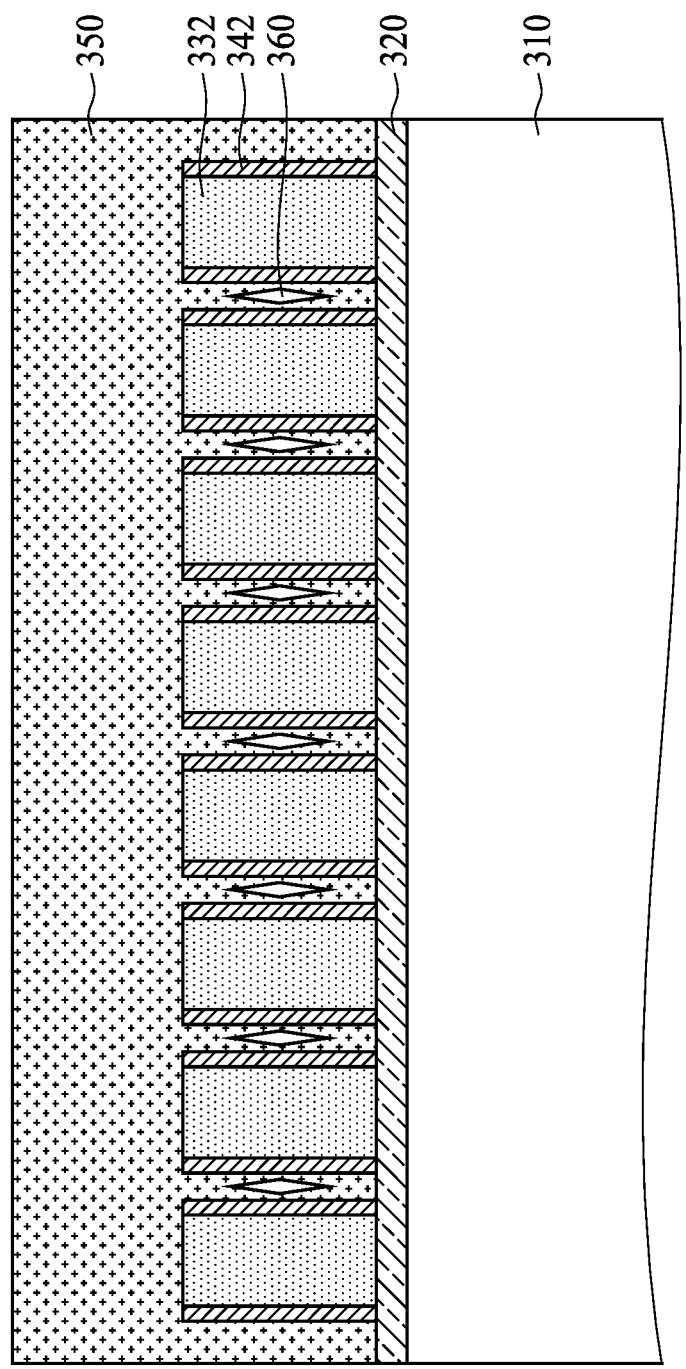

Referring to FIGS. 10 to 12, a passivation layer 350 is deposited to fill the trenches 334 between adjacent conductive features 342 according to a step S510 in FIG. 5. The passivation layer 350 is a dielectric material and is conformally and uniformly deposited on the diffusion barrier layer 320 and the conductive feature 342. In some embodiments, the trenches 334 can be entirely filled with the dielectric material by performing a high-density plasma CVD process. In other words, the passivation layer 350 shown in FIG. 11 is a void-free layer. Alternatively, a plurality of voids 360, holding an ambient gas (such as air), can be enclosed in the dielectric material for forming the passivation layer 350, as shown in FIG. 12, by performing a CVD process.

After the deposition of the of the passivation layer 350, a planarizing process can be performed to remove a portion of the passivation layer 350 above the conductive features 332. Thus, the semiconductor components 30 and 30A shown in FIGS. 4A and 4B are completely formed.

In conclusion, with the configuration of interconnect structure 300/300A, the conductive feature 332 is formed with continuous configuration using the double exposure (DE) technique or the double patterning (DP) technique. Therefore, the aspect ratio of the conductive features 332 is increased, thereby increasing the density of the conductive feature in the interconnect structure 300/300A.

One aspect of the present disclosure provides a semiconductor device. The semiconductor device includes a substrate, a diffusion barrier layer disposed on the substrate, a passivation layer disposed on the diffusion barrier layer, and a plurality of conductive features penetrating through the passivation layer and contacting the diffusion barrier layer.

One aspect of the present disclosure provides a method of manufacturing a semiconductor device. The method comprises steps of depositing a diffusion barrier layer on a substrate; depositing a conductive layer on the diffusion barrier layer; patterning the conductive layer using a target pattern as a mask to form a plurality of conductive features spaced by a plurality of trenches; and depositing a passivation layer in the trench.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor device, comprising:
　depositing a diffusion barrier layer on a substrate;
　depositing a conductive layer on the diffusion barrier layer;
　patterning the conductive layer using a target pattern as a mask to form a plurality of conductive features spaced by a plurality of trenches; and
　depositing a passivation layer in the trench,
　wherein the formation of the conductive features comprises:
　　applying a photosensitive layer on the conductive layer;
　　performing a first exposure process to expose portions of the photosensitive layer to actinic radiation through a mask;
　　performing a second exposure process to expose other portions of the photosensitive layer to actinic radiation through the mask;
　　performing a developing process to remove the portions exposed to the actinic radiation and form the target pattern; and
　　performing an etching process to remove portions of the conductive layer not covered by the target pattern.

2. The method of claim 1, further comprising forming a plurality of insulative liners on peripheries of the conductive features prior to the deposition of the passivation layer.

3. The method of claim 2, wherein the forming of the insulative liners comprises:
　depositing an insulative layer to cover the conductive features and portions of the diffusion barrier layer exposed through the trenches, wherein the insulative layer has a topology following the topology of the conductive features and the diffusion barrier layer; and
　removing portions of the insulative layer on topmost surfaces of the conductive features and the diffusion barrier layer.

4. The method of claim 1, further comprising enclosing a plurality of voids in the passivation layer.

5. A method of manufacturing a semiconductor device, comprising:
　depositing a diffusion barrier layer on a substrate;
　depositing a conductive layer on the diffusion barrier layer;
　patterning the conductive layer using a target pattern as a mask to form a plurality of conductive features spaced by a plurality of trenches; and
　depositing a passivation layer in the trench, wherein the formation of the conductive features comprises:
- forming a sacrificial layer on the conductive layer;
- applying a first photosensitive layer on the sacrificial layer;
- performing a first lithography process on the first photosensitive layer to remove portions of the first photosensitive layer exposed to actinic radiation through a mask;
- performing a first etching process to remove portions of the sacrificial layer not covered by unexposed portions of the first photosensitive layer to form a plurality of sacrificial blocks;
- applying a second photosensitive layer on the sacrificial blocks;
- performing a second lithography process on the second photoresist layer to remove portions of the second photosensitive layer exposed to actinic radiation through the mask;
- performing a second etching process to remove portions of the sacrificial blocks not covered by unexposed portions of the second photosensitive layer to form the target pattern; and
- performing a third etching process to remove portions of the conductive layer exposed through the target pattern.

6. The method of claim 1, wherein the diffusion barrier layer has a first thickness, and the conductive features have a second thickness greater than the first thickness.

7. The method of claim 6, wherein the second thickness of the conductive feature is less than 37 nm, and an aspect ratio of the conductive features is greater than 1.

* * * * *